(12) United States Patent
Kawanishi et al.

(10) Patent No.: US 12,388,031 B2
(45) Date of Patent: Aug. 12, 2025

(54) MEMORY DEVICE

(71) Applicant: Kioxia Corporation, Tokyo (JP)

(72) Inventors: Ayako Kawanishi, Yokkaichi (JP); Shinya Arai, Yokkaichi (JP)

(73) Assignee: Kioxia Corporation, Tokyo (JP)

( * ) Notice: Subject to any disclaimer, the term of this patent is extended or adjusted under 35 U.S.C. 154(b) by 511 days.

(21) Appl. No.: 17/822,248

(22) Filed: Aug. 25, 2022

(65) Prior Publication Data

US 2023/0307387 A1 Sep. 28, 2023

(30) Foreign Application Priority Data

Mar. 24, 2022 (JP) .................. 2022-048021

(51) Int. Cl.
*H01L 23/60* (2006.01)
*H01L 23/00* (2006.01)
*H01L 25/065* (2023.01)
*H01L 25/18* (2023.01)

(52) U.S. Cl.
CPC .............. *H01L 23/60* (2013.01); *H01L 24/08* (2013.01); *H01L 25/0657* (2013.01); *H01L 25/18* (2013.01); *H01L 2224/08145* (2013.01); *H01L 2924/1431* (2013.01); *H01L 2924/14511* (2013.01); *H01L 2924/30205* (2013.01)

(58) Field of Classification Search
CPC .................. H01L 25/0657; H01L 25/18; H01L 2224/08145; H01L 2924/1431; H01L 24/80; H01L 24/08; H01L 23/585; H01L 2225/06541; H01L 24/06; H10B 80/00; H10B 43/40; H10B 43/50
See application file for complete search history.

(56) References Cited

U.S. PATENT DOCUMENTS

| | | | |
|---|---|---|---|
| 10,978,505 B2 | 4/2021 | Sato et al. | |
| 11,114,171 B2* | 9/2021 | Shin | H10B 43/40 |
| 12,232,323 B2* | 2/2025 | Jung | H10D 64/037 |
| 2020/0235123 A1 | 7/2020 | Sugiura et al. | |
| 2021/0066277 A1* | 3/2021 | Kim | H10B 43/50 |
| 2021/0066282 A1* | 3/2021 | Kim | H10D 88/00 |

(Continued)

FOREIGN PATENT DOCUMENTS

| JP | 2020-92146 A | 6/2020 |
| JP | 2021-136320 A | 9/2021 |
| JP | 2022-035158 | 3/2022 |

*Primary Examiner* — Mamadou L Diallo
(74) *Attorney, Agent, or Firm* — Oblon, McClelland, Maier & Neustadt, L.L.P.

(57) ABSTRACT

A first chip includes a substrate, and first and second electrodes in a second region surrounding a first region. A second chip includes an interconnect layer, third and fourth electrodes in the second region, and first and second walls. Each of the first and third electrodes and the first wall includes a conductor surrounding the first region. The first and second electrodes are respectively in contact with the third and fourth electrodes. The first and second walls are in contact with the interconnect layer and are electrically coupled to the substrate via the first and third electrodes and the second and fourth electrodes, respectively. Each of a first ratio of an area covered by the first and second electrodes to the second region and a second ratio of an area of the third and fourth electrodes to the second region is 3% or more and 40% or less.

20 Claims, 17 Drawing Sheets

(56) References Cited

U.S. PATENT DOCUMENTS

| | | | |
|---|---|---|---|
| 2021/0265293 A1 | 8/2021 | Tagami | |
| 2021/0265314 A1 | 8/2021 | Arai | |
| 2021/0296298 A1* | 9/2021 | Sanuki | H01L 25/50 |
| 2022/0028804 A1 | 1/2022 | Mitsuhashi et al. | |
| 2022/0085052 A1 | 3/2022 | Watarai et al. | |
| 2022/0375953 A1* | 11/2022 | Roh | H10B 43/27 |
| 2023/0170302 A1* | 6/2023 | Gu | H10B 43/50 |
| | | | 257/314 |
| 2023/0255037 A1* | 8/2023 | Cho | H10B 43/27 |
| | | | 257/777 |

* cited by examiner

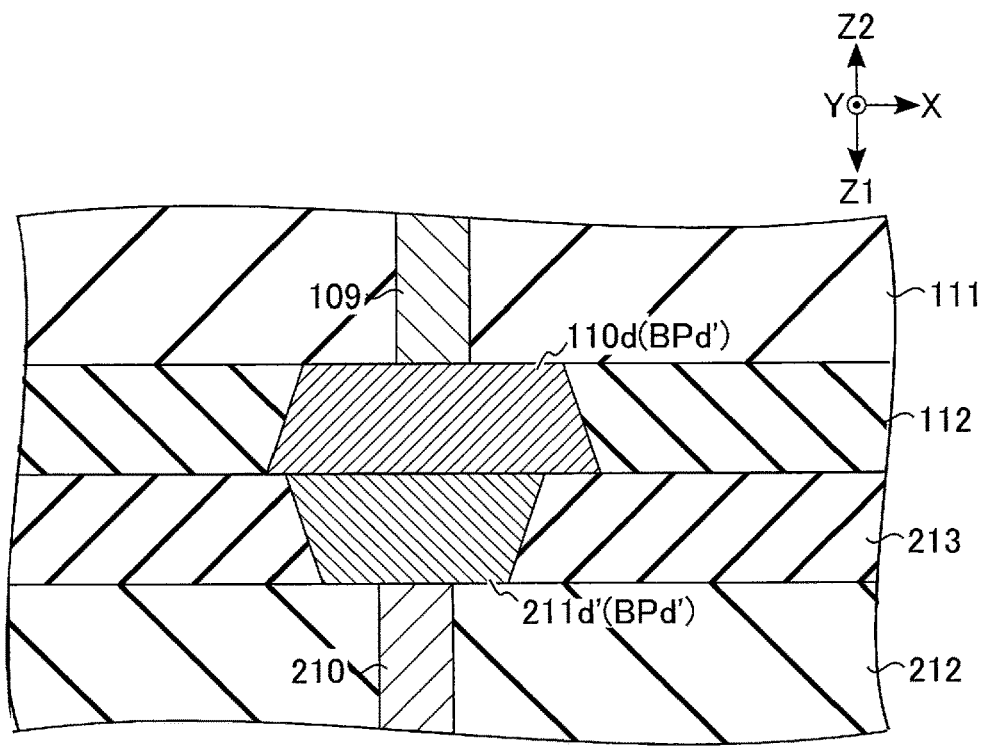
F I G. 12
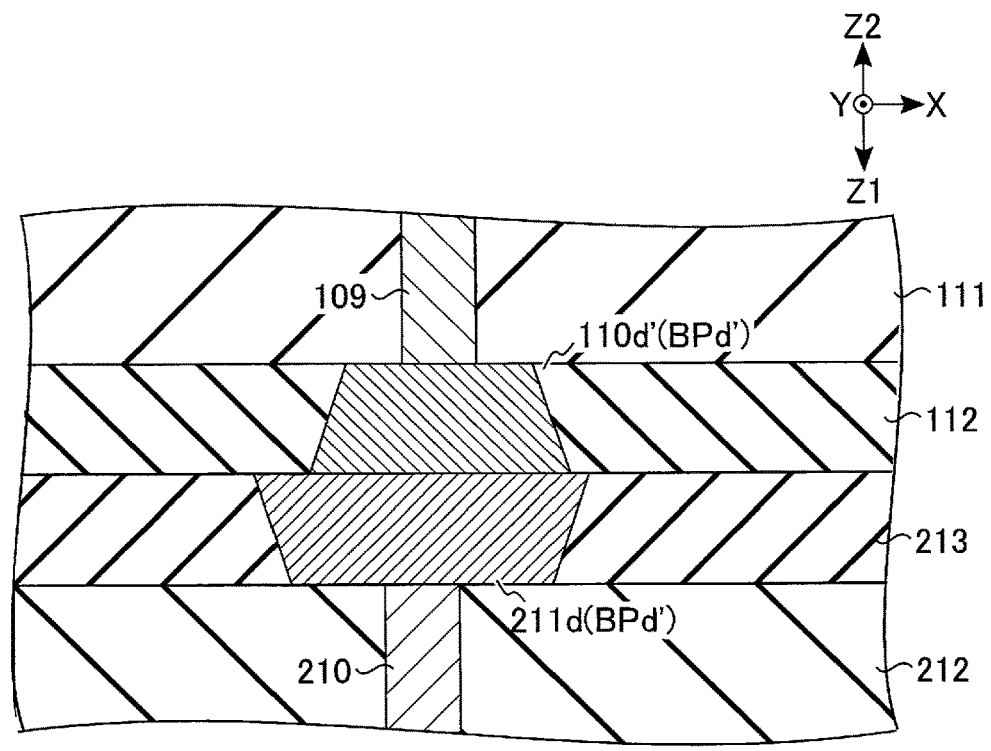
F I G. 13

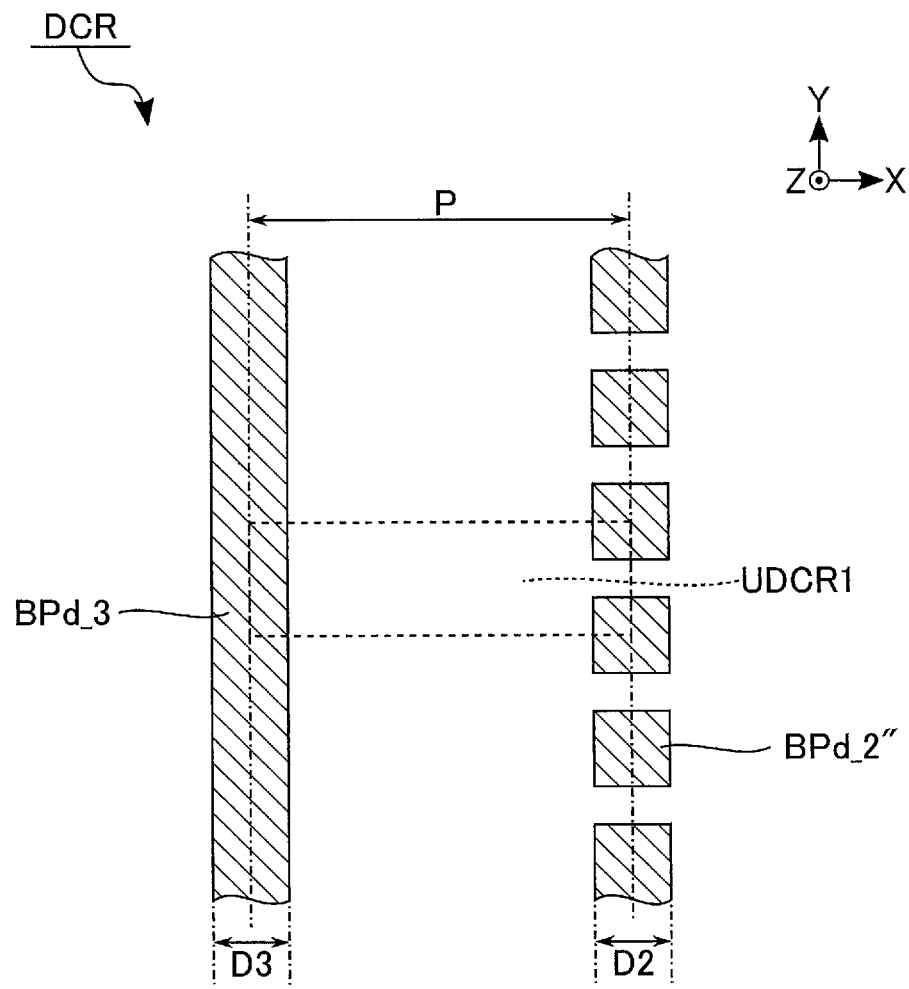
F I G. 15

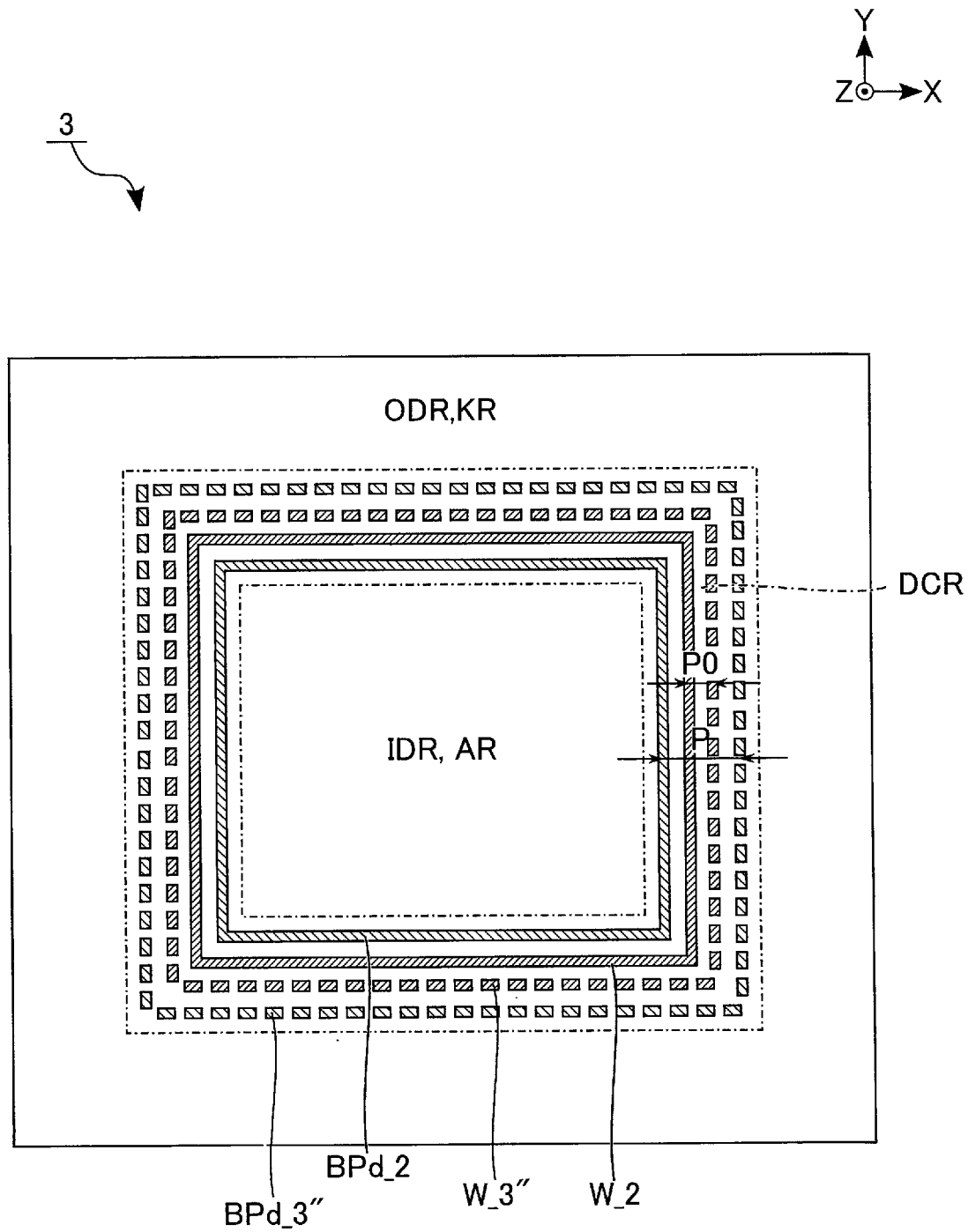
F I G. 16

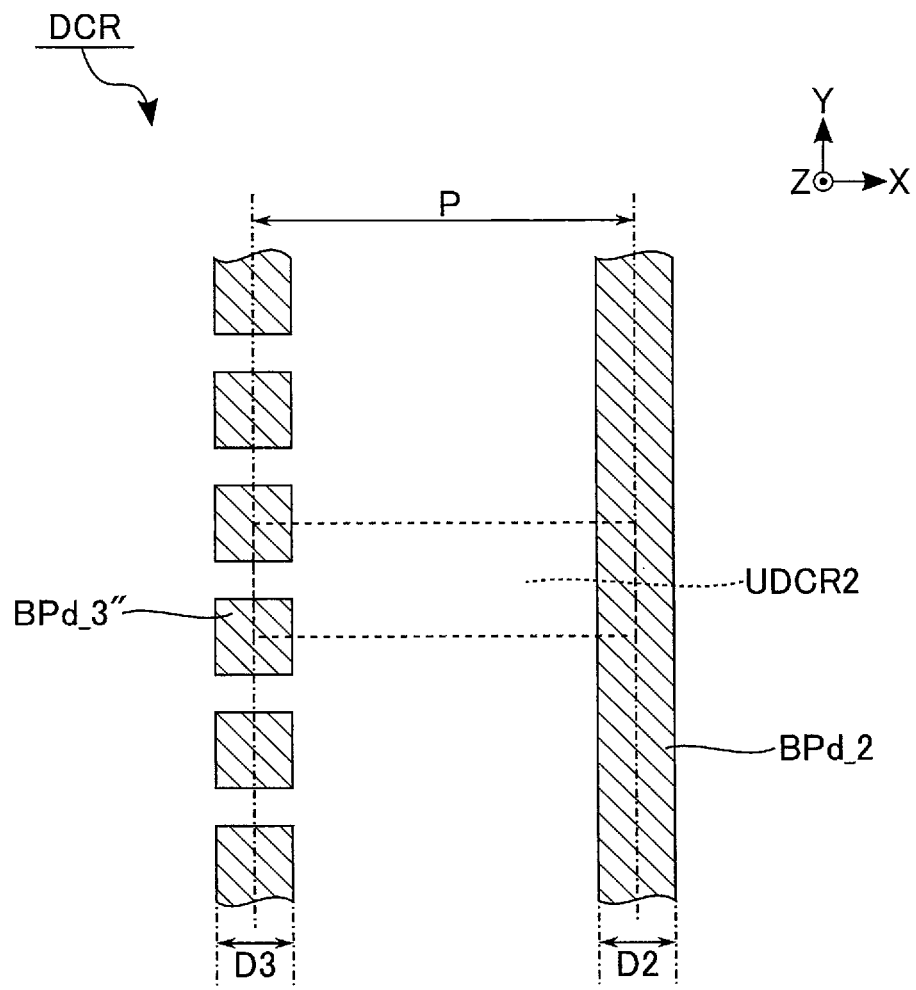
F I G. 17

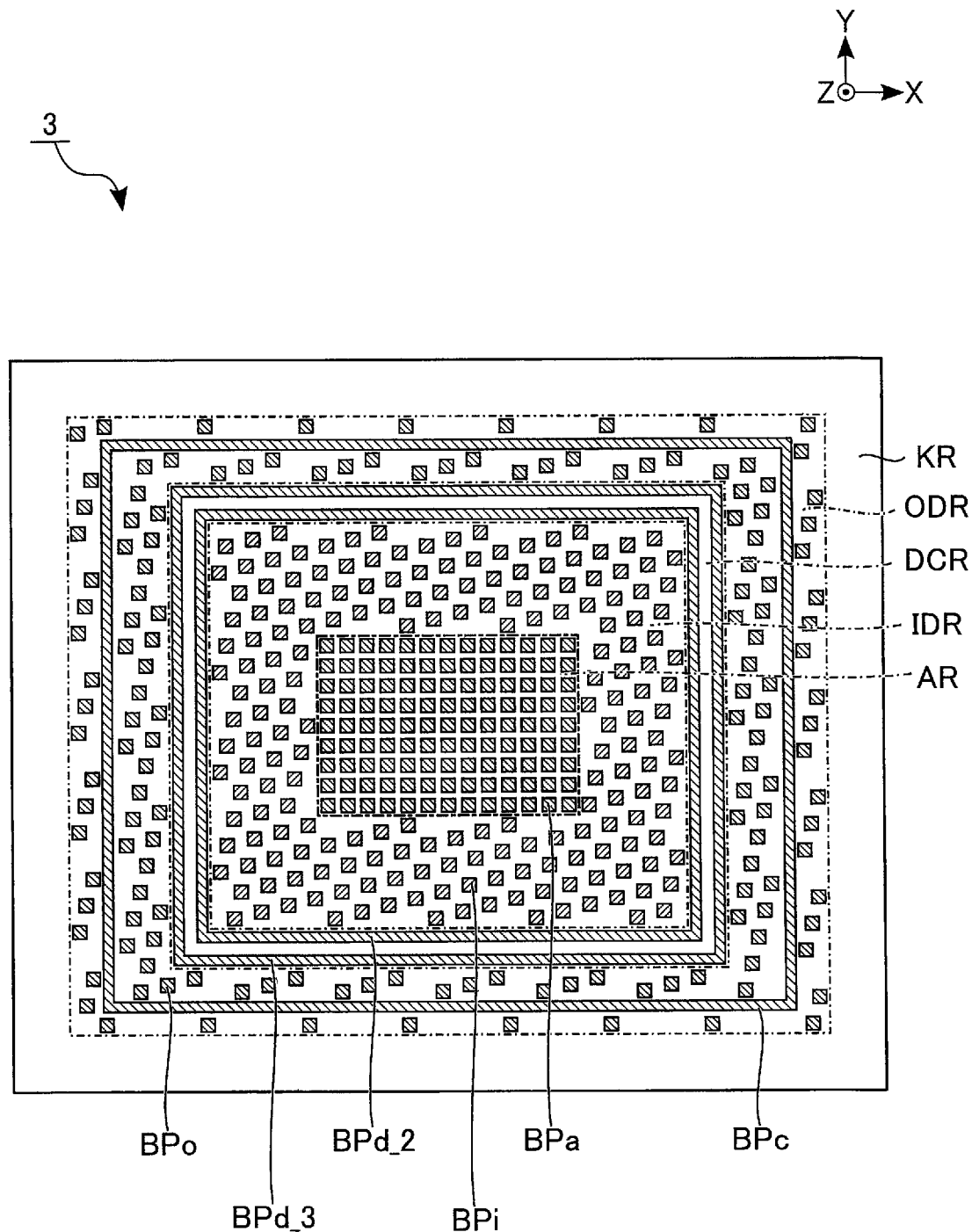
F I G. 18

MEMORY DEVICE

CROSS-REFERENCE TO RELATED APPLICATIONS

This application is based upon and claims the benefit of priority from Japanese Patent Application No. 2022-048021, filed Mar. 24, 2022, the entire contents of which are incorporated herein by reference.

FIELD

Embodiments described herein relate generally to a memory device.

BACKGROUND

A NAND flash memory is known as a memory device capable of storing data therein in a nonvolatile manner. In a memory device such as a NAND flash memory, a three-dimensional memory structure is used for higher integration and larger capacity.

BRIEF DESCRIPTION OF THE DRAWINGS

FIG. 12 is a sectional view illustrating a first example of a sectional structure of a bonding pad of a memory device according to a second embodiment.

FIG. 13 is a sectional view illustrating a second example of a sectional structure of a bonding pad of the memory device according to the second embodiment.

FIG. 15 is a plan view illustrating a first example of a planar layout of bonding pads in the discharge pad region of the memory device according to the third embodiment.

FIG. 16 is a plan view illustrating a second example of a planar layout of a part of wall structures and bonding pads in the discharge pad region of the memory device according to the third embodiment.

FIG. 17 is a plan view illustrating a second example of a planar layout of bonding pads in the discharge pad region of the memory device according to the third embodiment.

FIG. 18 is a plan view illustrating an example of a planar layout of bonding pads of a memory device according to a first modification.

DETAILED DESCRIPTION

Figure 1:
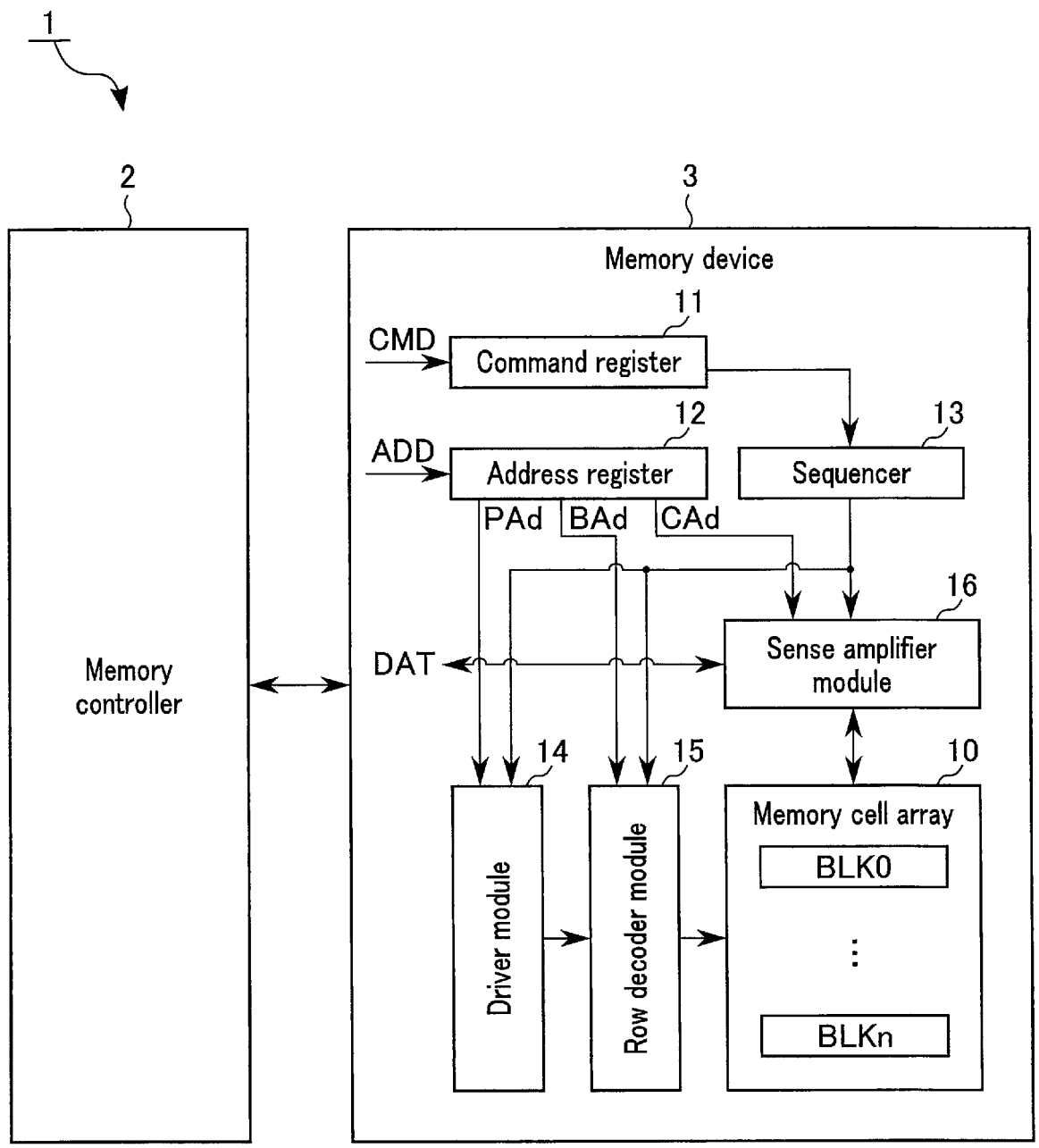
FIG. 1 is a block diagram illustrating an example of a configuration of a memory system including a memory device according to a first embodiment.

In general, according to one embodiment, a memory device includes: a first chip and a second chip that are in contact with each other on a first surface divided into a first region, a second region surrounding the first region, and a third region surrounding the second region. The first chip includes: a substrate including a first diffusion region of a first conductivity type and a second diffusion region of a second conductivity type different from the first conductivity type; a first electrode unit including a continuous conductor surrounding the first region in the second region; and a second electrode unit surrounding the first region while being spaced from the first electrode unit in the second region. The second chip includes: a first interconnect layer; a third electrode unit including a continuous conductor surrounding the first region in the second region and being in contact with the first electrode unit; a fourth electrode unit surrounding the first region while being spaced from the third electrode unit in the second region and being in contact with the second electrode unit; a first wall unit being in contact with the first interconnect layer, including a continuous conductor surrounding the first region, and being electrically coupled to the first diffusion region via the third electrode unit and the first electrode unit; and a second wall unit being in contact with the first interconnect layer, surrounding the first region while being spaced from the first wall unit, and being electrically coupled to the second diffusion region via the fourth electrode unit and the second electrode unit. Each of a first ratio of an area covered by the first electrode unit and the second electrode unit to the second region, and a second ratio of an area covered by the third electrode unit and the fourth electrode unit to the second region is equal to or more than 3% and is equal to or less than 40%.

Below, embodiments will be described with reference to the drawings. Dimensions and ratios in the drawings are not necessarily the same as actual ones.

In the following description, components having substantially the same functions and configurations are denoted by the same reference signs. In some portions, components having similar configurations are denoted by the same reference signs with different characters or numbers at their ends, when specifically distinguished from each other.

1. First Embodiment

1.1 Configuration

1.1.1 Configuration of Memory System

FIG. 1 is a block diagram illustrating an example of a configuration of a memory system including a memory device according to a first embodiment. The memory system 1 is a storage device configured so as to be connected to an external host device (not illustrated). The memory system 1 is, for example, a memory card such as an SD™ card, a universal flash storage (UFS), or a solid state drive (SSD). The memory system 1 includes a memory controller 2 and a memory device 3.

The memory controller 2 includes, for example, an integrated circuit such as a system-on-a-chip (SoC). The memory controller 2 controls the memory device 3 in response to a request from the host device. Specifically, for example, the memory controller 2 writes data of which writing is requested by the host device, into the memory device 3. Further, the memory controller 2 reads data of which reading is requested by the host device, from the memory device 3, and transmits the data to the host device.

The memory device 3 is a nonvolatile memory. The memory device 3 is, for example, a NAND flash memory. The memory device 3 stores data therein in a nonvolatile manner.

Communication between the memory controller 2 and the memory device 3 conforms to, for example, a single data rate (SDR) interface, a toggle double data rate (DDR) interface, or an open NAND flash interface (ONFI).

1.1.2 Configuration of Memory Device

Subsequently, an internal configuration of the memory device according to the first embodiment will be described with reference to the block diagram illustrated in FIG. 1. The memory device 3 includes, for example, a memory cell array 10, a command register 11, an address register 12, a sequencer 13, a driver module 14, a row decoder module 15, and a sense amplifier module 16.

The memory cell array 10 includes a plurality of blocks BLK0 to BLKn (n is an integer of one or more). The number of blocks BLK included in the memory cell array 10 may be one. The block BLK is a set of a plurality of memory cells. The block BLK is used, for example, as a unit of data erasing. Further, a plurality of bit lines and a plurality of word lines are provided in the memory cell array 10. Each of the memory cells is brought into correspondence with a bit line and a word line, for example. A detailed configuration of the memory cell array 10 will be described later.

The command register 11 stores therein a command CMD received by the memory device 3 from the memory controller 2. The command CMD includes, for example, a command for causing the sequencer 13 to perform a read operation, a write operation, an erase operation, and the like.

The address register 12 stores therein address information ADD received by the memory device 3 from the memory controller 2. The address information ADD includes, for example, a block address BAd, a page address PAd, and a column address CAd. For example, the block address BAd, the page address PAd, and the column address CAd are used to select the block BLK, a word line, and a bit line, respectively.

The sequencer 13 controls the operation of the entire memory device 3. For example, the sequencer 13 controls the driver module 14, the row decoder module 15, the sense amplifier module 16, and the like in accordance with the command CMD held in the command register 11 to perform a read operation, a write operation, an erase operation, and the like.

The driver module 14 generates a voltage used in a read operation, a write operation, an erase operation, and the like. Then, the driver module 14 applies the generated voltage to a signal line corresponding to a selected word line based on the page address PAd stored in the address register 12, for example.

The row decoder module 15 selects a corresponding one of the blocks BLK in the memory cell array 10 based on the block address BAd stored in the address register 12. Then, the row decoder module 15 transfers, for example, the voltage applied to the signal line corresponding to the selected word line, to the selected word line in the selected block BLK.

The sense amplifier module 16 applies a desired voltage to each bit line in accordance with write data DAT received from the memory controller 2 in a write operation. Further, in a read operation, the sense amplifier module 16 determines data stored in the memory cell based on the voltage of the bit line, and transfers a result of the determination to the memory controller 2 as read data DAT.

1.1.3 Circuit Configuration of Memory Cell Array

Figure 2:
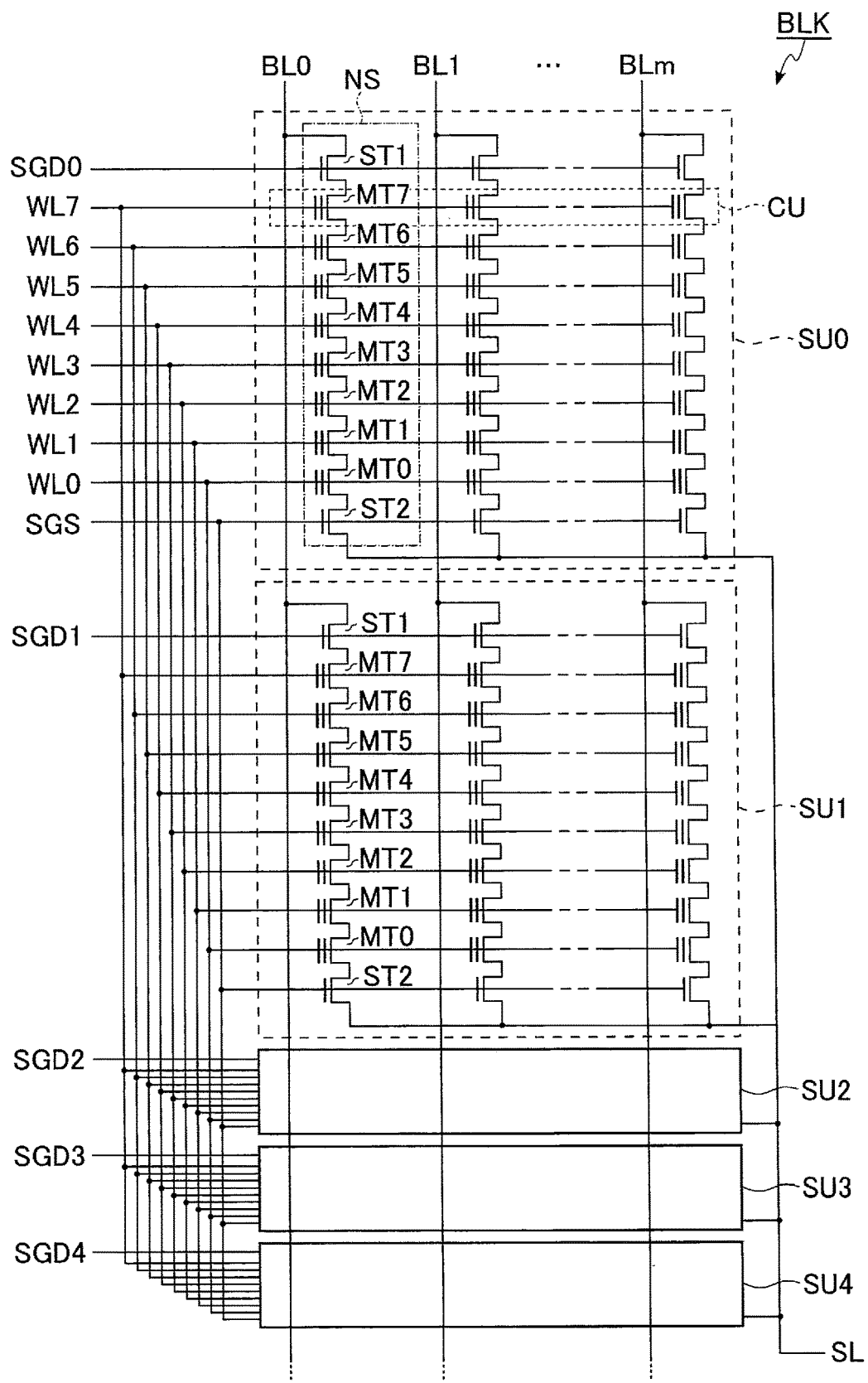
FIG. 2 is a circuit diagram illustrating an example of a circuit configuration of a memory cell array included in the memory device according to the first embodiment.

FIG. 2 is a circuit diagram illustrating an example of a circuit configuration of the memory cell array included in the memory device according to the first embodiment. FIG. 2 illustrates one block BLK among the plurality of blocks BLK included in the memory cell array 10. As illustrated in FIG. 2, the block BLK includes, for example, five string units SU0 to SU4.

Each string unit SU includes a plurality of NAND strings NS that are brought into correspondence with bit lines BL0 to BLm (m is an integer of one or more), respectively. The number of the bit lines BL may be one. Each NAND string NS includes, for example, memory cell transistors MT0 to MT7 and select transistors ST1 and ST2. Each memory cell transistor MT includes a control gate and a charge storage unit, and stores data in a nonvolatile manner. Each of the select transistors ST1 and ST2 is used to select the string unit SU during various operations.

In each NAND string NS, the memory cell transistors MT0 to MT7 are coupled in series. A drain of the select transistor ST1 is coupled to its corresponding bit line BL. A source of the select transistor ST1 is coupled to one end of the memory cell transistors MT0 to MT7 coupled in series. A drain of the select transistor ST2 is coupled to the other end of the memory cell transistors MT0 to MT7 coupled in series. A source of the select transistor ST2 is coupled to a source line SL.

In one same block BLK, control gates of the memory cell transistors MT0 to MT7 are coupled to word lines WL0 to WL7, respectively. Gates of the select transistors ST1 in the string units SU0 to SU4 are coupled to select gate lines SGD0 to SGD4, respectively. Gates of the plurality of select transistors ST2 are coupled to a select gate line SGS.

Different column addresses are assigned to the bit lines BL0 to BLm, respectively. Each bit line BL is shared by the NAND strings NS to which the same column address is assigned among the plurality of blocks BLK. The word lines WL0 to WL7 are provided for each of the blocks BLK. The source line SL is shared by the plurality of blocks BLK, for example.

A set of the plurality of memory cell transistors MT coupled to the common word line WL in one string unit SU is referred to as, for example, a cell unit CU. For example, the storage capacity of the cell unit CU including the memory cell transistors MT each storing therein one-bit data is defined as "one-page data". The cell unit CU can have a storage capacity of two-page data or more depending on the number of bits of data stored in the memory cell transistors MT.

Note that the circuit configuration of the memory cell array 10 included in the memory device 3 according to the first embodiment is not limited to the above-described configuration. For example, it can be designed such that the number of string units SU included in each block BLK is a freely-selected number. It can be designed such that each of the number of memory cell transistors MT and the number of select transistors ST1 and ST2 included in each NAND string NS is a freely-selected number.

1.1.4 Bonded Structure of Memory Device

Next, an overview of a bonded structure of the memory device according to the first embodiment will be provided.

1.1.4.1 Overview of Bonded Structure

Figure 3:
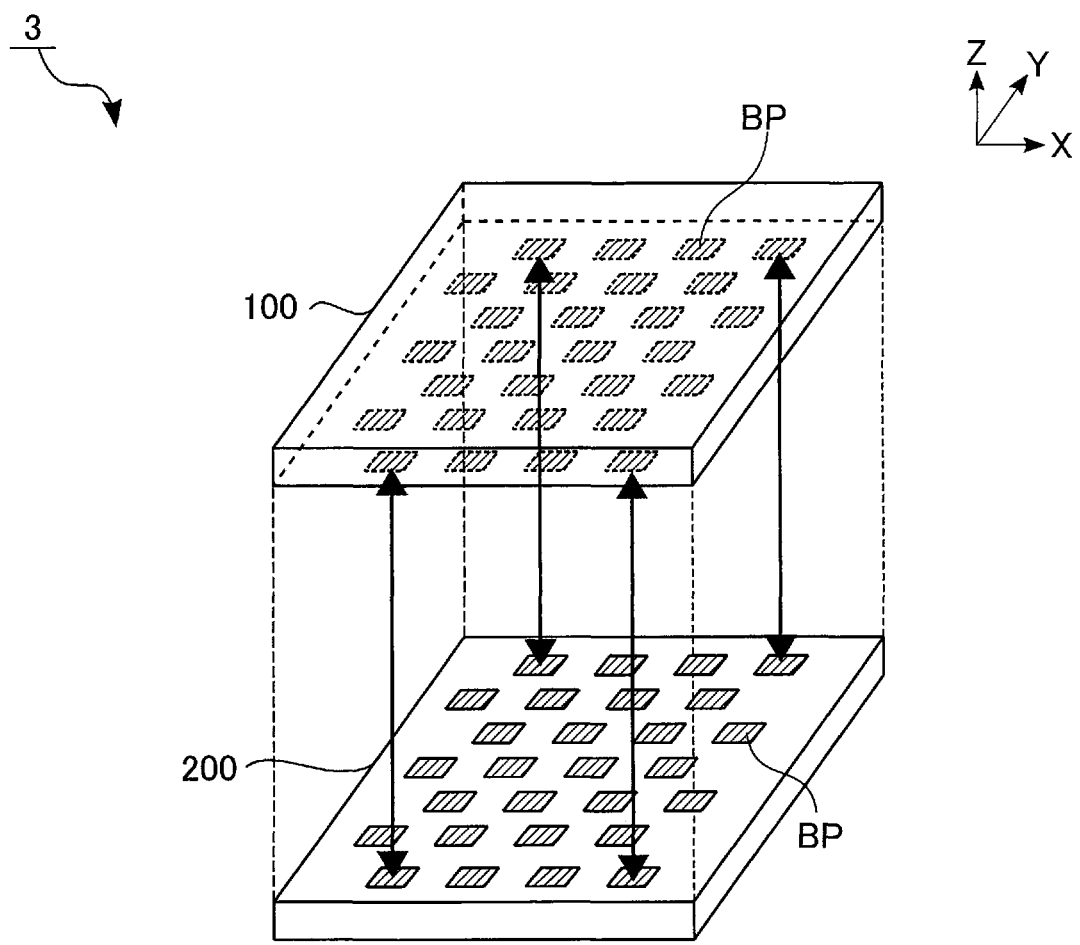
FIG. 3 is a perspective view providing an overview of a bonded structure of the memory device according to the first embodiment.

FIG. 3 is a perspective view providing an overview of a bonded structure of the memory device according to the first embodiment.

As illustrated in FIG. 3, the memory device 3 includes a memory chip 100 and a CMOS chip 200. The memory chip 100 includes a structure corresponding to the memory cell array 10. The CMOS chip 200 includes, for example, structures corresponding to the command register 11, the address register 12, the sequencer 13, the driver module 14, the row decoder module 15, and the sense amplifier module 16.

Further, each of the memory chip 100 and the CMOS chip 200 includes a plurality of bonding pads BP. The memory device 3 is formed of the memory chip 100 and the CMOS chip 200 that are bonded via the plurality of bonding pads BP.

Hereinafter, a surface (bonded surface) in which the memory chip 100 and the CMOS chip 200 are bonded is referred to as an XY plane. Directions perpendicular to each other in the XY plane are defined as an X direction and a Y direction. Further, a direction substantially perpendicular to the XY plane and goes from the memory chip 100 toward the CMOS chip 200 is defined as a Z1 direction. A direction substantially perpendicular to the XY plane and goes from the CMOS chip 200 toward the memory chip 100 is defined as a Z2 direction. A direction that is limited to neither the Z1 direction nor the Z2 direction is referred to as a Z direction.

1.1.4.2 Planar Layout of Bonding Pads

Figure 4:
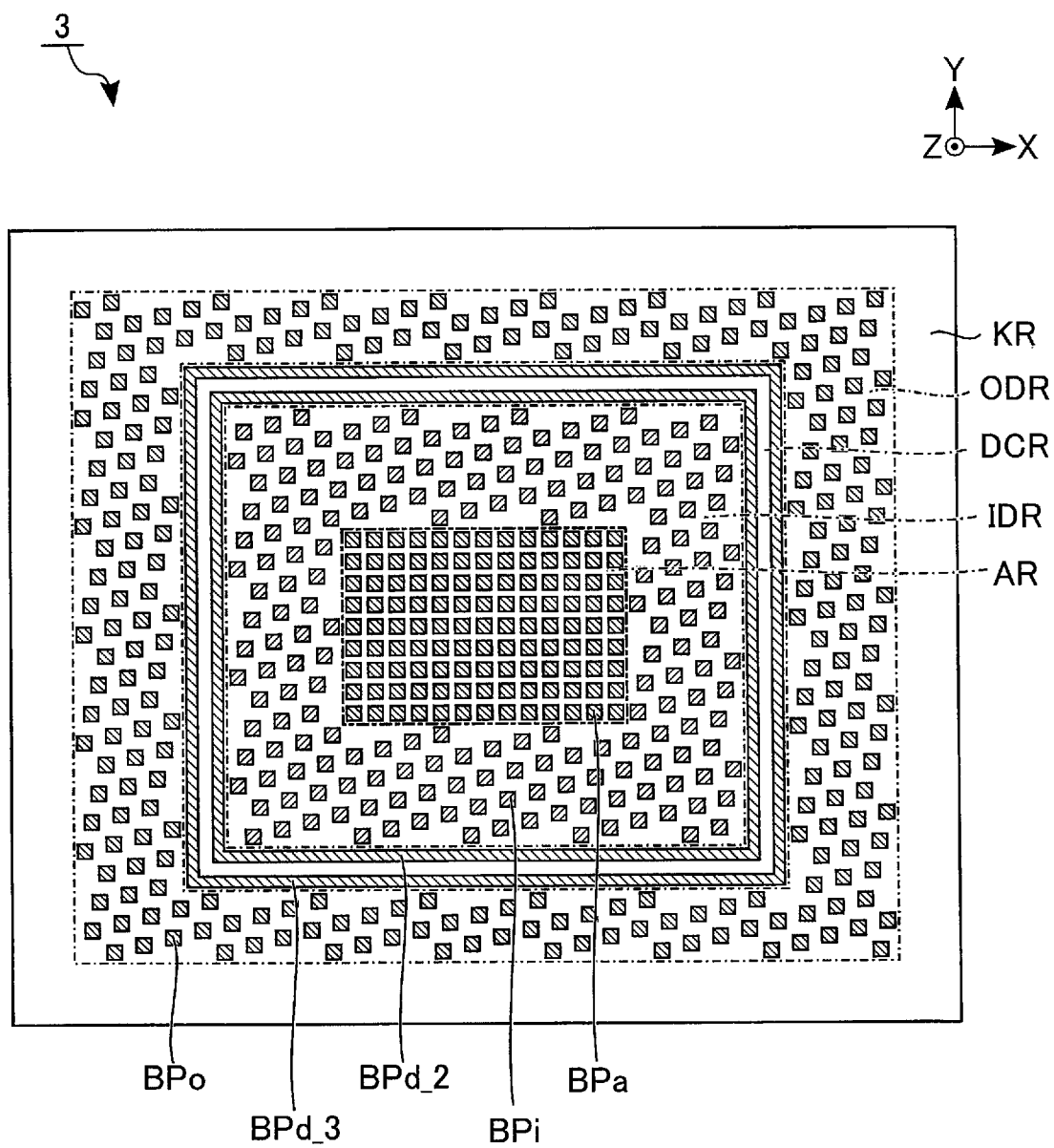
FIG. 4 is a plan view illustrating an example of a planar layout of bonding pads of the memory device according to the first embodiment.

Next, a planar layout of bonding pads of the memory device according to the first embodiment will be described. FIG. 4 is a plan view illustrating an example of a planar layout of bonding pads of the memory device according to the first embodiment.

As illustrated in FIG. 4, the bonded surface between the memory chip 100 and the CMOS chip 200 of the memory device 3 is divided into an active pad region AR, an inner dummy pad region IDR, a discharge pad region DCR, an outer dummy pad region ODR, and a kerf region KR, for example. Further, the bonding pads BP are classified into bonding pads BPa, BPi, BPd, and BPo according to regions where they are arranged in the bonded surface. The bonding pad BPd includes bonding pads BPd_2 and BPd_3.

The active pad region AR is a rectangular region positioned in the center of the memory device 3 when viewed along the Z direction. The number and shape of the active pad regions AR can be designed in a freely-selected manner. In the active pad region AR, the bonding pad BPa is arranged. The bonding pad BPa is a conductor that functions as a path of a signal or a power supply in activating the memory device 3. The bonding pad BPa includes a plurality of electrodes each having a rectangular shape, for example. The plurality of electrodes included in the bonding pad BPa are arranged in a square grid pattern, for example.

The inner dummy pad region IDR is a rectangle-ring-shaped region that is positioned inside the discharge pad region DCR and surrounds the circumference of the active pad region AR when viewed along the Z direction. In the inner dummy pad region IDR, the bonding pad BPi is arranged. The bonding pad BPi is a conductor that is positioned inside the discharge pad region DCR and does not function as a path of a signal or a power supply in activating the memory device 3. The bonding pad BPi includes a plurality of electrodes each having a rectangular shape, for example. The plurality of electrodes included in the bonding pad BPi are arranged in a pattern different from a square grid pattern, for example.

The discharge pad region DCR is a rectangle-ring-shaped region that surrounds the circumference of the inner dummy pad region IDR when viewed along the Z direction. In the discharge pad region DCR, the bonding pads BPd_2 and BPd_3 are arranged. Each of the bonding pads BPd_2 and BPd_3 is a conductor that functions as a discharge path for dissipating static electricity generated on a side closer to the memory chip 100 to a side closer to the CMOS chip 200. Each of the bonding pads BPd_2 and BPd_3 includes, for example, a continuous electrode. The electrode included in the bonding pad BPd_2 has a rectangle-ring shape surrounding the bonding pads BPa and BPi. The electrode included in the bonding pad BPd_3 has a rectangle-ring shape surrounding the bonding pad BPd_2 while being spaced from the bonding pad BPd_2.

The outer dummy pad region ODR is a rectangle-ring-shaped region that surrounds the circumference of the discharge pad region DCR when viewed along the Z direction. In the outer dummy pad region ODR, the bonding pad BPo is arranged. The bonding pad BPo is a conductor that is positioned outside the discharge pad region DCR and does not function as a path of a signal or a power supply in activating the memory device 3. The bonding pad BPo includes a plurality of electrodes each having a rectangular shape, for example. The plurality of electrodes included in the bonding pad BPo are arranged in a pattern different from a square grid pattern, for example. Note that the arrangement pattern of the plurality of electrodes included in the bonding pad BPo may be equal to or different from the arrangement pattern of the plurality of electrodes included in the bonding pad BPi.

The kerf region KR is a rectangle-ring-shaped region that surrounds the circumference of the outer dummy pad region ODR when viewed along the Z direction. The kerf region KR is in contact with the outermost edge of a semiconductor substrate. In the kerf region KR, no bonding pad is provided. In the kerf region KR, an alignment mark or the like used during manufacture of the memory device 3 is provided, for example. A portion forming a structural body in the kerf region KR may be removed by a dicing process of cutting a plurality of memory devices 3 formed on a wafer into chips.

1.1.4.3 Coverage of Bonding Pad

Next, a coverage of a bonding pad of the memory device according to the first embodiment will be described. A coverage of the bonding pad BP in a certain region of the bonded surface is a ratio of an area covered by the bonding pad BP arranged in the certain region, to the certain region.

1.1.4.3.1 Coverage in Discharge Pad Region

Figure 5:
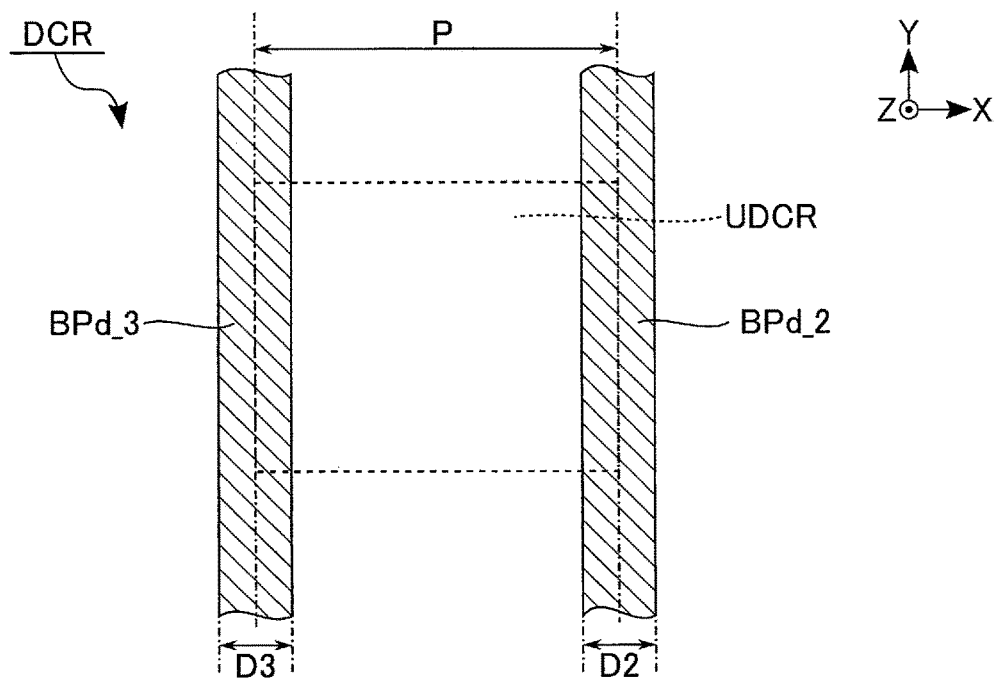
FIG. 5 is a plan view illustrating an example of a planar layout of bonding pads in a discharge pad region of the memory device according to the first embodiment.

FIG. 5 is a plan view illustrating an example of a planar layout of bonding pads in the discharge pad region of the memory device according to the first embodiment. FIG. 5 illustrates a part of the bonding pads BPd_2 and BPd_3 arranged in the discharge pad region DCR illustrated in FIG. 4.

As illustrated in FIG. 5, the bonding pads BPd_2 and BPd_3 have widths D2 and D3, respectively. The widths D2 and D3 may be equal to or different from each other. The widths D2 and D3 are equal to or more than 0.1 micrometer (μm) and equal to or less than 1.0 micrometer, for example.

The coverage of the bonding pads BPd_2 and BPd_3 in the discharge pad region DCR is calculated as a ratio of the area covered by the bonding pads BPd_2 and BPd_3 to the area of a unit region UDCR, for example. The unit region UDCR is, for example, a rectangular region having a line passing through the centers of the width D2 of each position in the bonding pad BPd_2 and a line passing through the centers of the width D3 of each position in the bonding pad BPd_3 as two opposing sides. The length of a side connecting the center of the width D2 of the bonding pad BPd_2 and the center of the width D3 of the bonding pad BPd_3 in the unit region UDCR is defined as a distance P. As illustrated in FIG. 5, in a case where each of the bonding pads BPd_2 and BPd_3 has a rectangle-ring shape, the coverage of the bonding pads BPd_2 and BPd_3 in the discharge pad region DCR is expressed as, for example, (D2/2+D3/2)/P. It is designed such that the coverage of the bonding pads BPd_2 and BPd_3 in the discharge pad region DCR is equal to or more than 3% and equal to or less than 40%, for example. If the coverage of the bonding pads BPd_2 and BPd_3 in the discharge pad region DCR is less than 3%, the bonding pads may unsatisfactorily function as a discharge path for dissipating static electricity generated on a side closer to the memory chip 100, to a side closer to the CMOS chip 200, which is undesirable. If the coverage of the bonding pads BPd_2 and BPd_3 in the discharge pad region DCR is more than 40%, there is a possibility that a bonding failure cannot be satisfactorily suppressed in the bonding process of the memory chip 100 and the CMOS chip 200, which is undesirable.

1.1.4.3.2 Coverage in Outer Dummy Pad Region

Figure 6:
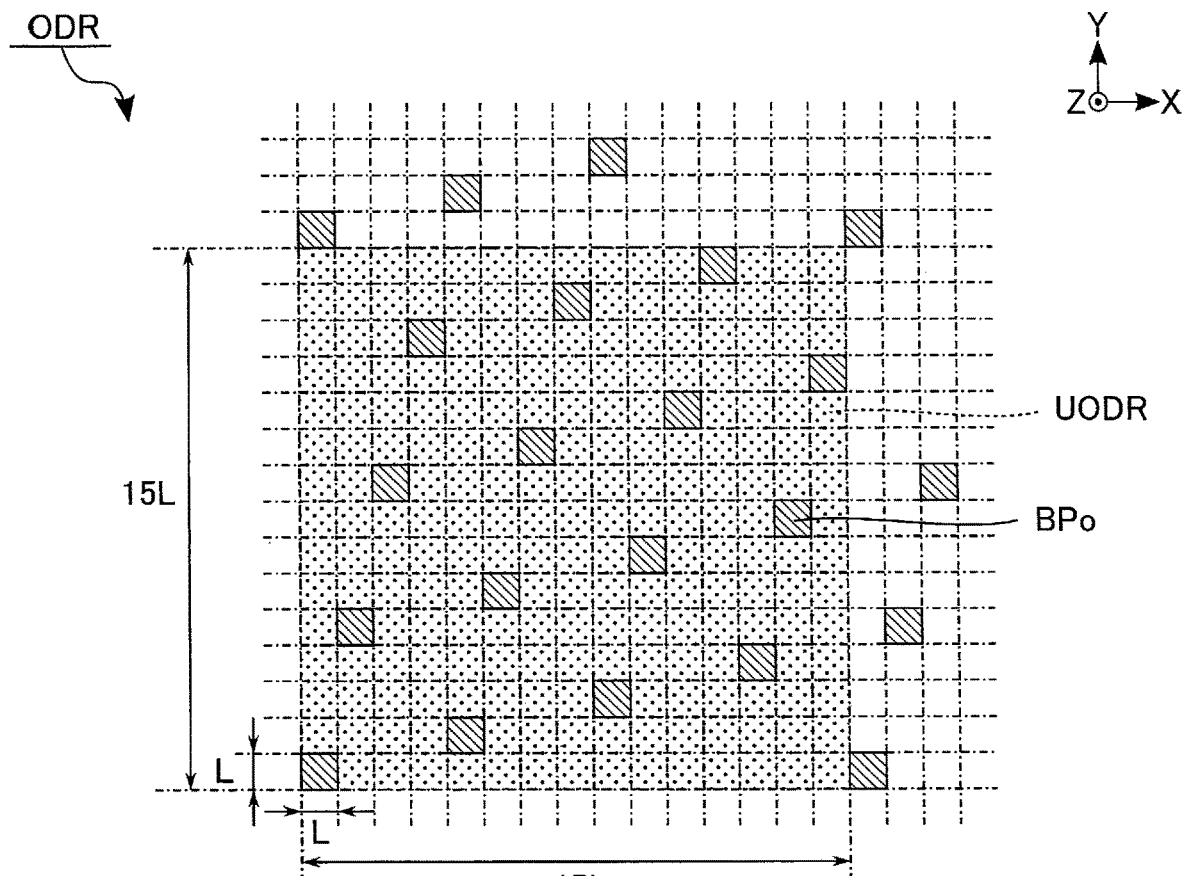
FIG. 6 is a plan view illustrating an example of a planar layout of bonding pads in an outer dummy pad region of the memory device according to the first embodiment.

FIG. 6 is a plan view illustrating an example of a planar layout of the bonding pads in the outer dummy pad region of the memory device according to the first embodiment. FIG. 6 illustrates a part of the plurality of electrodes included in the bonding pad BPo arranged in the outer dummy pad region ODR illustrated in FIG. 4. In addition, in FIG. 6, for convenience in description, the outer dummy pad region ODR is illustrated as being divided into cells each having a side of L in a square grid pattern.

As illustrated in FIG. 6, in the outer dummy pad region ODR, an electrode included in the bonding pad BPo is arranged in one-to-one correspondence with a cell. Note that the area of an electrode included in the bonding pad BPo may be equal to or different from the area ($=L^2$) of a cell.

In the outer dummy pad region ODR, the plurality of electrodes included in the bonding pad BPo are arranged in a predetermined pattern, for example. The example of FIG. 6 shows a pattern in which 15 electrodes are arranged in a unit region UODR of 15×15 cells. In this case, with respect to a cell in which a reference electrode is arranged, further electrodes are arranged in a cell that is four-cell and one-cell away along the X direction and the Y direction, respectively, and in a cell that is one-cell and four-cell away along the X direction and the Y direction, respectively.

The coverage of the bonding pad BPo in the outer dummy pad region ODR is calculated as a ratio of the area covered by the bonding pad BPo to the area of the unit region UODR, for example. In the example of FIG. 6, it is designed such that the coverage of the bonding pad BPo in the outer dummy pad region ODR is equal to or more than 3% or and equal to or less than 20%, for example. Further, preferably, it is designed such that the coverage of the bonding pad BPo in the outer dummy pad region ODR is equal to or more than ⅓ and equal to or less than ⅔ of the coverage of the bonding pads BPd_2 and BPd_3 in the discharge pad region DCR. In a case where the above-mentioned provision is not satisfied, there is a possibility that a bonding failure cannot be satisfactorily suppressed in the bonding process of the memory chip 100 and the CMOS chip 200, which is undesirable.

1.1.4.3.3 Coverage in Active Pad Region and Inner Dummy Pad Region

It is designed such that the coverage of the bonding pad BPa in the active pad region AR is, for example, equal to or less than 25% (more specifically, 16%, for example).

Preferably, the coverage of the bonding pad BPi in the inner dummy pad region IDR is between the coverage of the bonding pad BPa in the active pad region AR and the coverage of the bonding pads BPd_2 and BPd_3 in the discharge pad region DCR, for example.

1.1.5 Sectional Structure of Memory Device

Figure 7:
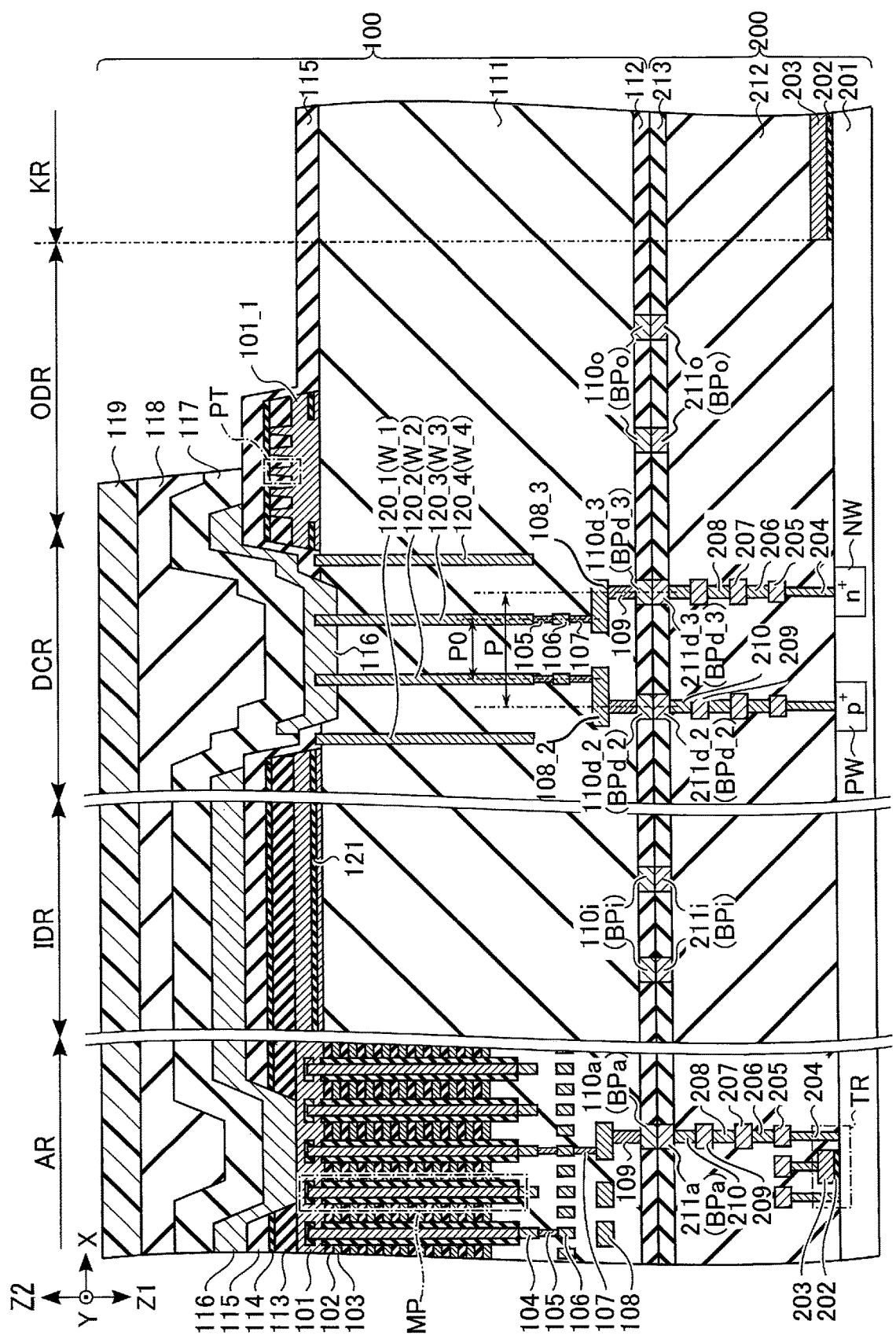
FIG. 7 is a sectional view illustrating an example of a sectional structure of the memory device according to the first embodiment.

Next, a sectional structure of the memory device according to the first embodiment will be described. FIG. 7 is a sectional view illustrating an example of a sectional structure of the memory device according to the first embodiment.

As illustrated in FIG. 7, the memory chip 100 includes a semiconductor layer 101, insulating layers 102, 111, 112, 113, 114, 115, 117, 118, and 121, interconnect layers 103, 106, 108, and 116, conductors 104, 105, 107, 109, and 120, an electrode 110, a surface protection layer 119, and a memory pillar MP. The electrode 110 includes electrodes 110a, 110i, 110d, and 110o. The CMOS chip 200 includes a semiconductor substrate 201, an N-type impurity diffusion region NW, a P-type impurity diffusion region PW, a transistor TR, a gate insulating film 202, a gate electrode 203, conductors 204, 206, 208, and 210, interconnect layers 205, 207, and 209, an electrode 211, and insulating layers 212 and 213. The electrode 211 includes electrodes 211a, 211i, 211d, and 211o.

1.1.5.1 Sectional Structure of Memory Chip

First, the structure of the memory chip 100 will be described.

1.1.5.1.1 Structure of Active Pad Region

The active pad region AR of the memory chip 100 will be described. In the active pad region AR of the memory chip 100, the memory cell array 10 and various interconnects for connecting the memory cell array 10 and the CMOS chip 200 are provided. In other words, the active pad region AR of the memory chip 100 includes a memory region in which the memory cell array 10 is provided.

The semiconductor layer 101 extends along the X direction and the Y direction. The semiconductor layer 101 provided in the active pad region AR functions as the source line SL. For example, the semiconductor layer 101 contains silicon. In the active pad region AR, a plurality of insulating layers 102 and a plurality of interconnect layers 103 are stacked so as to alternate one by one on the upper surface of the semiconductor layer 101 located in the Z1 direction. In the example of FIG. 7, 10 insulating layers 102 and 10 interconnect layers 103 are stacked so as to alternate one by one. In other words, the plurality of stacked interconnect layers 103 are provided between the CMOS chip 200 and the semiconductor layer 101 while being spaced away from the CMOS chip 200 and the semiconductor layer 101 along the Z direction. The interconnect layers 103 extend along the X direction. The interconnect layers 103 function as the word lines WL and the select gate lines SGD and SGS. The insulating layers 102 contain silicon oxide (SiO) as an insulating material. The interconnect layers 103 contain, for example, tungsten (W) as a conductive material.

A plurality of memory pillars MP are provided in the active pad region AR. The memory pillar MP corresponds to the NAND string NS. The memory pillar MP has, for example, a cylindrical shape extending along the Z direction. The memory pillar MP penetrates (passes through) the plurality of insulating layers 102 and the plurality of interconnect layers 103. The end (bottom surface) of the memory pillar MP located in the Z2 direction reaches the semiconductor layer 101. The memory pillar MP includes a semiconductor layer. A part of the semiconductor layer in the memory pillar MP is in contact with the semiconductor layer 101. Details of the structure of the memory pillar MP will be provided later.

The conductor 104 is provided on the upper surface of the memory pillar MP located in the Z1 direction. The conductor 104 has, for example, a cylindrical shape extending along the Z direction. The conductor 105 is provided on the upper surface of the conductor 104 located in the Z1 direction. The conductor 105 provided in the active pad region AR has, for example, a cylindrical shape extending along the Z direction. Further, the interconnect layer 106 is provided on the upper surface of the conductor 105 located in the Z1 direction. In the active pad region AR, for example, a plurality of interconnect layers 106 arranged along the X direction and each extending along the Y direction are provided. Each of the plurality of memory pillars MP is electrically coupled to any one of the plurality of interconnect layers 106 via the conductors 104 and 105. The interconnect layers 106 coupled to the memory pillars MP function as the bit lines BL. The conductor 104 contains, for example, tungsten. The conductor 105 and the interconnect layers 106 contain, for example, copper (Cu).

The conductor 107 is provided on the upper surface of the interconnect layer 106 located in the Z1 direction. The conductor 107 provided in the active pad region AR has, for example, a cylindrical shape extending along the Z direction. The interconnect layer 108 is provided on the upper surface of the conductor 107 located in the Z1 direction. The conductor 109 is provided on the upper surface of the interconnect layer 108 located in the Z1 direction. The conductor 109 provided in the active pad region AR has, for example, a cylindrical shape extending along the Z direction. In the active pad region AR, the electrode 110a is provided on the upper surface of the conductor 109 located in the Z1 direction. The electrode 110a is electrically coupled to the electrode 211a of the CMOS chip 200. The electrodes 110a and 211a function as the bonding pads BPa.

Each of the plurality of interconnect layers 106 in the active pad region AR is electrically coupled to any one of the electrodes 110a via the conductor 107, the interconnect layer 108, and the conductor 109. The conductors 107 and 109, the interconnect layer 108, and the electrode 110a contain, for example, copper as a conductive material. Note that the number of interconnect layers provided between the interconnect layer 106 and the electrode 110a is freely selected.

Note that in the active pad region AR, in addition to the above-described electrode 110a, the electrode 110a that electrically couples the interconnect layer 103 and the CMOS chip 200, the electrode 110a that electrically couples the external device and the CMOS chip 200, and the like are provided though illustration of such electrodes are omitted in FIG. 7.

The insulating layer 111 is provided so as to cover the insulating layer 102, the interconnect layer 103, the memory pillar MP, the conductor 104, the conductor 105, the interconnect layer 106, the conductor 107, the interconnect layer 108, and the conductor 109. The insulating layer 112 is provided on the upper surface of the insulating layer 111 located in the Z1 direction. The plurality of electrodes 110a are provided in the same layer as the insulating layer 112. The insulating layer 112 is in contact with the insulating layer 213 of the CMOS chip 200.

The insulating layers 113 and 114 are stacked on the upper surface of the semiconductor layer 101 located in the Z2 direction. Then, the insulating layer 115 is provided so as to cover the semiconductor layer 101 and the insulating layers 113 and 114. The insulating layers 113 and 115 contain, for example, silicon oxide as an insulating material. For the insulating layer 114, an insulating material having a function as an antioxidant against metal (for example, copper) is used. The insulating layer 114 contains, for example, silicon carbonitride (SiCN) or silicon nitride (SiN). Note that the insulating layer 114 may be omitted.

The interconnect layer 116 is provided on the upper surface of the insulating layer 115 located in the Z2 direction. The interconnect layer 116 provided in the active pad region AR is in contact with the semiconductor layer 101 in a region where the insulating layers 113 to 115 on the semiconductor layer 101 are removed. The interconnect layer 116 provided in the active pad region AR, which is in contact with the semiconductor layer 101, thereby functions as a part of an interconnect layer that electrically connects the semiconductor layer 101 (source line SL) and the CMOS chip 200. The interconnect layer 116 contains, for example, aluminum (Al).

The insulating layer 117 is provided on the upper surface of the interconnect layer 116 located in the Z2 direction. The insulating layer 118 is provided on the upper surface of the insulating layer 117 located in the Z2 direction. Then, the surface protection layer 119 is provided on the upper surface of the insulating layer 118 located in the Z2 direction. The insulating layer 117 contains, for example, silicon oxide as an insulating material. The insulating layer 118 contains, for example, silicon nitride as an insulating material having low water permeability. The surface protection layer 119 contains, for example, a resin material such as polyimide.

1.1.5.1.2 Structure of Inner Dummy Pad Region

Next, the inner dummy pad region IDR of the memory chip 100 will be described.

In the inner dummy pad region IDR, the plurality of electrodes 110$i$ are provided in the same layer as the insulating layer 112. Each of the plurality of electrodes 110$i$ is in contact with its corresponding electrode 211$i$ of the CMOS chip 200. The electrodes 110$i$ and 211$i$ function as the bonding pad BPi. The plurality of electrodes 110$i$ are electrically insulated from the memory cell array 10 and various interconnects in the memory chip 100, and the semiconductor substrate 201 and various interconnects in the CMOS chip 200.

The insulating layer 121 is provided within the semiconductor layer 101 provided in the inner dummy pad region IDR. The semiconductor layer 101 provided in the inner dummy pad region IDR does not function as the source line SL.

1.1.5.1.3 Structure of Discharge Pad Region

Next, the discharge pad region DCR of the memory chip 100 will be described.

In the discharge pad region DCR, a wall structure W and various interconnects for connecting the wall structure W and the CMOS chip 200 are provided. The wall structure W includes, for example, wall structures W_1, W_2, W_3, and W_4. The wall structures W_1 to W_4 include conductors 120_1 to 120_4, respectively.

The conductor 120_1 has a rectangle-ring shape surrounding the active pad region AR and the inner dummy pad region IDR when viewed along the Z direction. The conductor 120_2 has a rectangle-ring shape surrounding the conductor 120_1 when viewed along the Z direction. The conductor 120_3 has a rectangle-ring shape surrounding the conductor 120_2 when viewed along the Z direction. The conductor 120_4 has a rectangle-ring shape surrounding the conductor 120_3 when viewed along the Z direction.

Each of the conductors 120_1 to 120_4 extends along the Z direction. The end of each of the conductors 120_1 and 120_4 located in the Z2 direction is in contact with, for example, the insulating layer 115. The ends of the conductors 120_1 and 120_4 located in the Z2 direction may be in contact with the semiconductor layer 101 or the interconnect layer 116, or may be located within the insulating layer 111. The end of each of the conductors 120_2 and 120_3 located in the Z2 direction is in contact with the interconnect layer 116 in a region where the semiconductor layer 101 and the insulating layers 113 to 115 are removed, for example.

Note that the interconnect layer 116 provided in the discharge pad region DCR is electrically insulated from the interconnect layer 116 provided in the active pad region AR and the interconnect layer 116 provided in the inner dummy pad region IDR. The interconnect layer 116 provided in the discharge pad region DCR is covered with the surface protection layer 119 or the like.

The end of each of the conductors 120_1 and 120_4 located in the Z1 direction is not coupled to the conductor 105. The end of the conductor 120_2 located in the Z1 direction and the end of the conductor 120_3 located in in the Z1 direction are electrically coupled to the electrodes 211$d$ of the CMOS chip 200 via different conductors 105, different interconnect layers 106, different conductors 107, different interconnect layers 108, different conductors 109, and different electrodes 110$d$, respectively.

Hereinafter, the interconnect layer 108 and the electrodes 110$d$ and 211$d$ that are electrically coupled to the conductor 120_2 will be referred to as an interconnect layer 108_2 and electrodes 110$d$_2 and 211$d$_2, respectively, when need to be identified. The interconnect layer 108 and the electrodes 110$d$ and 211$d$ that are electrically connected to the conductor 120_3 will be referred to as an interconnect layer 108_3 and electrodes 110$d$_3 and 211$d$_3, respectively, when need to be identified.

The conductor 105, the interconnect layer 106, the conductor 107, the interconnect layer 108_2, the conductor 109, and the electrode 110$d$_2 that are electrically coupled to the electrode 211$d$_2 each have, for example, a rectangle-ring shape surrounding the active pad region AR and the inner dummy pad region IDR when viewed along the Z direction. Further, for example, the width of the interconnect layer 108_2 having a ring shape when viewed along the Z direction is larger than the width of the interconnect layer 106 having a ring shape in the same manner. Each of the conductor 105, the interconnect layer 106, the conductor 107, the interconnect layer 108_3, the conductor 109, and the electrode 110$d$_3 that are electrically coupled to the electrode 211$d$_3 each have, for example, a rectangle-ring shape surrounding the conductor 105, the interconnect layer 106, the conductor 107, the interconnect layer 108_2, the conductor 109, and the electrode 110$d$_2 that are electrically coupled to the electrode 211$d$_2, when viewed along the Z direction. Further, for example, the width of the interconnect layer 108_3 having a ring shape when viewed along the Z direction is larger than the width of the interconnect layer 106 having a ring shape in the same manner. The electrodes 110$d$2 and 211$d$_2 function as the bonding pad BPd_2. The electrodes 110$d$3 and 211$d$_3 function as the bonding pad BPd_3.

A portion coupled to the conductor 109 in the interconnect layer 108_2 is positioned closer to the inner dummy pad region IDR than a portion coupled to the conductor 107 in the interconnect layer 108_2. Thus, the conductor 107 and the conductor 109 coupled to the upper and lower surfaces of the interconnect layer 108_2 do not overlap each other when viewed along the Z direction. Accordingly, the bonding pad BPd_2 is positioned closer to the inner dummy pad region IDR than the conductor 120_2. Meanwhile, a portion coupled to the conductor 109 in the interconnect layer 108_3 is positioned closer to the outer dummy pad region ODR than a portion coupled to the conductor 107 in the interconnect layer 108_3. Thus, the conductor 107 and the conductor 109 coupled to the upper and lower surfaces of the interconnect layer 108_3 do not overlap each other when viewed along the Z direction. Accordingly, the bonding pad BPd_3 is positioned closer to the outer dummy pad region ODR than the conductor 120_3. For this reason, the distance P between the bonding pad BPd_2 and the bonding pad BPd_3 is longer than a distance P0 between the conductor 120_2 and the conductor 120_3.

Figure 8:
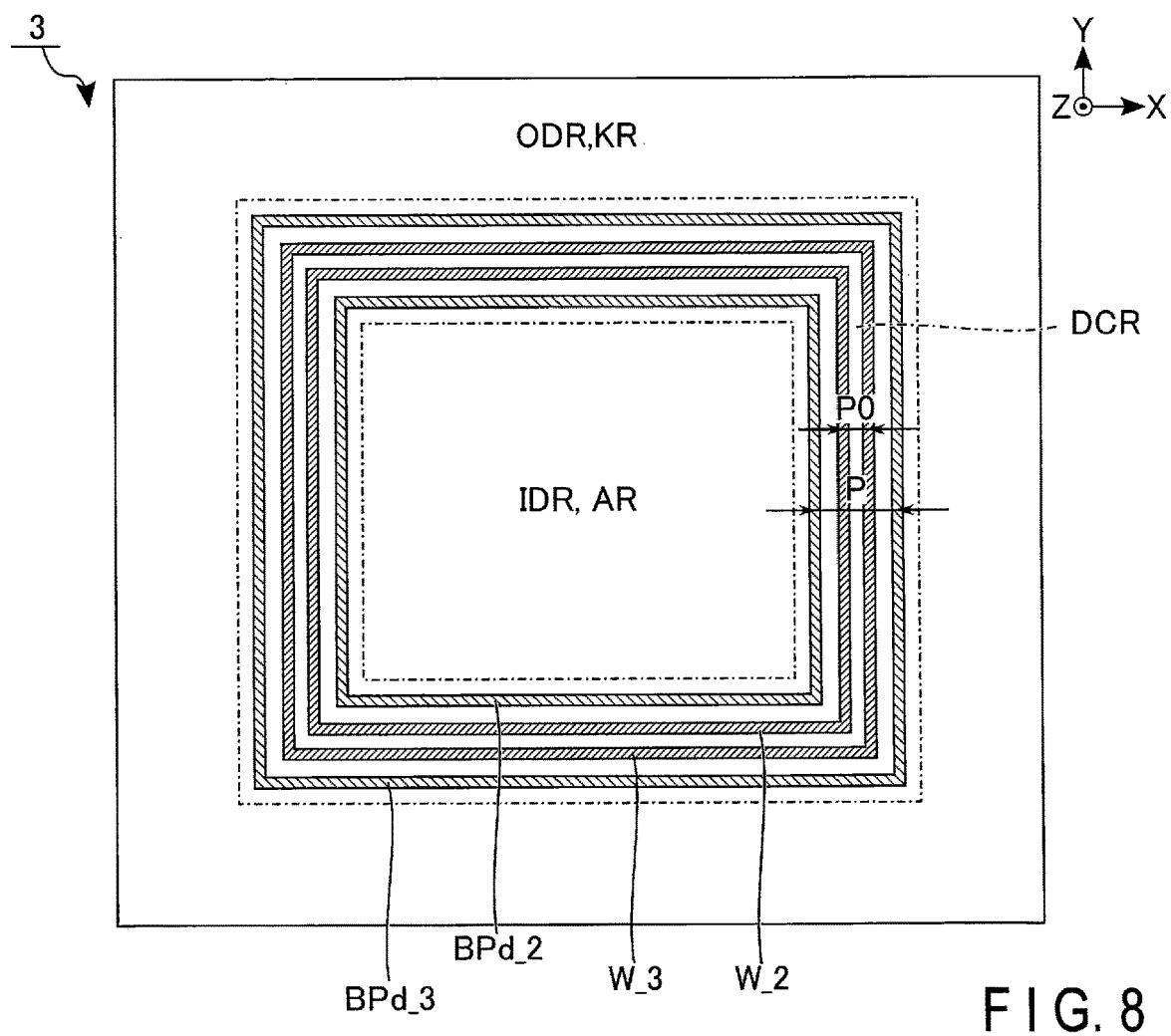
FIG. 8 is a plan view illustrating an example of a planar layout of a part of wall structures and the bonding pads in the discharge pad region of the memory device according to the first embodiment.

FIG. 8 is a plan view illustrating an example of a planar layout of a part of the wall structures and the bonding pads in the discharge pad region of the memory device according to the first embodiment. FIG. 8 illustrates an example of a planar layout of the wall structures W_2 (the conductor 120_2) and W_3 (the conductor 120_3) and the bonding pads BPd_2 and BPd_3.

As illustrated in FIG. 8, the wall structure W_2 is provided so as to surround the bonding pad BPd_2 when viewed along the Z direction. The wall structure W_3 is provided so as to surround the wall structure W_2 when viewed along the Z direction. The bonding pad BPd_3 is provided so as to surround the wall structure W_3 when viewed along the Z direction. As described above, because of the distance P between the bonding pad BPd_2 and the bonding pad BPd_3 that is made longer than the distance P0 between the wall structure W_2 and the wall structure W_3, the coverage of the bonding pad BPd_2 and the bonding pad BPd_3 in the discharge pad region DCR can be reduced. Note that in the discharge pad region DCR, the distance P between the bonding pad BPd_2 and the bonding pad BPd_3 may be made longer than the distance P0 between the conductor 120_2 and the conductor 120_3 by an increase of the width of the interconnect layer 106 as compared to the width of the interconnect layer 108 to differentiate the positions of the conductor 105 and the conductor 107 coupled to the upper and the lower surfaces thereof.

1.1.5.1.4 Structure of Outer Dummy Pad Region

Next, referring back to FIG. 7, the outer dummy pad region ODR of the memory chip 100 will be described.

In the outer dummy pad region ODR, the plurality of electrodes 1100 are provided in the same layer as the insulating layer 112. Each of the plurality of electrodes 1100 is in contact with its corresponding electrode 211o of the CMOS chip 200. The electrodes 110o and 211o function as the bonding pad BPo. The plurality of electrodes 110o are electrically insulated from various interconnects in the memory chip 100 and various interconnects in the CMOS chip 200.

The semiconductor layer 101 provided in the outer dummy pad region ODR is electrically insulated from the semiconductor layer 101 provided in the active pad region AR and the semiconductor layer 101 provided in the inner dummy pad region IDR. Hereinafter, the semiconductor layer 101 provided in the outer dummy pad region ODR will be referred to as a semiconductor layer 101_1 when needs to be identified. At least a portion of the semiconductor layer 101_1 is not covered with (protected by) the surface protection layer 119. In other words, at least a portion of the semiconductor layer 101_1 is not provided between the CMOS chip 200 and the surface protection layer 119 along the Z direction.

A plurality of protruding portions PT extending in the Z2 direction are provided on the upper surface of the semiconductor layer 101_1 located in the Z2 direction. The protruding portions PT penetrate the insulating layer 113, for example. The upper surfaces of the protruding portions PT located in the Z2 direction are in contact with the insulating layer 114. In the insulating layer 121 provided within the semiconductor layer 101_1, a portion that overlaps the protruding portions PT when viewed along the Z direction is divided by the semiconductor layer 101_1. In the manufacturing process of the memory chip 100, the protruding portions PT are used to ground the semiconductor layer 101 to a substrate (not illustrated) of the memory chip 100 to suppress arcing due to charge-up of the semiconductor layer 101 during dry etching, for example. Note that the protruding portions PT may be omitted.

1.1.5.1.5 Structure of Kerf Region

Next, the kerf region KR of the memory chip 100 will be described.

In the kerf region KR, the electrode 110 is not provided. Further, in the kerf region KR, the semiconductor layer 101, the interconnect layer 116, and the surface protection layer 119 that protects them are not provided.

1.1.5.2 Sectional Structure of CMOS Chip

Next, a sectional structure of the CMOS chip 200 will be described.

In the active pad region AR, the plurality of transistors TR are provided on the upper surface of the semiconductor substrate 201 located in the Z2 direction. The transistors TR are used as elements of the command register 11, the address register 12, the sequencer 13, the driver module 14, the row decoder module 15, and the sense amplifier module 16. The transistor TR includes the gate insulating film 202, the gate electrode 203, and a source and a drain (not illustrated) formed on the semiconductor substrate 201. The gate insulating film 202 is provided on the upper surface of the semiconductor substrate 201 located in the Z2 direction. The gate electrode 203 is provided on the upper surface of the gate insulating film 202 located in the Z2 direction.

The gate insulating film 202 and the gate electrode 203 are not provided in the inner dummy pad region IDR, the discharge pad region DCR, and the outer dummy pad region ODR. On the other hand, in the kerf region KR, the gate insulating film 202 and the gate electrode 203 that do not function as a part of the transistor TR are provided. The gate insulating film 202 and the gate electrode 203 that do not function as a part of the transistor TR in the kerf region KR are used for formation of an alignment mark, for example. The end of the gate electrode 203 that does not function as a part of the transistor TR defines a boundary between the kerf region KR and the outer dummy pad region ODR in some cases.

In the active pad region AR, the conductor 204 is provided on the upper surfaces located in the Z2 direction, of the gate electrode 203, the source, and the drain. The conductor 204 provided in the active pad region AR has a cylindrical shape extending along the Z direction. In the discharge pad region DCR, the conductor 204 is coupled on the upper surfaces located in the Z2 direction, of the N-type impurity diffusion region NW provided in the semiconductor substrate 201 and the P-type impurity diffusion region PW provided in the semiconductor substrate 201.

The interconnect layer 205 is provided on the upper surface of the conductor 204 located in the Z2 direction. The conductor 206 is provided on the upper surface of the interconnect layer 205 located in the Z2 direction. The interconnect layer 207 is provided on the upper surface of the conductor 206 located in the Z2 direction. The conductor 208 is provided on the upper surface of the interconnect layer 207 located in the Z2 direction. The interconnect layer 209 is provided on the upper surface of the conductor 208 located in the Z2 direction. The conductor 210 is provided on the upper surface of the interconnect layer 209 located in the Z2 direction. The conductors 204, 206, 208, and 210 provided in the active pad region AR each have, for example, a cylindrical shape extending along the Z direction. The conductors 204, 206, 208, and 210 and the interconnect layers 205, 207, and 209 provided in the discharge pad region DCR each have, for example, a rectangle-ring shape surrounding the active pad region AR and the inner dummy pad region IDR when viewed along the Z direction. The N-type impurity diffusion region NW and the P-type impurity diffusion region PW provided in the discharge pad region DCR each may have a rectangle-ring shape in the same manner as the above-described layers, or may be provided so as to include a plurality of regions that are arranged so as to surround the active pad region AR and the inner dummy pad region IDR while being spaced from each other along a rectangle-ring shape. Note that the number of interconnect layers in the CMOS chip 200 is freely selected.

The insulating layer 212 is provided on the upper surface of the semiconductor substrate 201 located in the Z2 direction. The insulating layer 212 is provided so as to cover the transistor TR, the conductor 204, the interconnect layer 205, the conductor 206, the interconnect layer 207, the conductor 208, the interconnect layer 209, and the conductor 210. The insulating layer 213 is provided on the upper surface of the insulating layer 212 located in the Z2 direction.

On the upper surface located in the Z2 direction, of the conductor 210 in the active pad region AR, the electrode 211a is provided in the same layer as the insulating layer 213. In the inner dummy pad region IDR, the electrode 211i is provided in the same layer as the insulating layer 213. In the outer dummy pad region ODR, the electrode 211o is provided in the same layer as the insulating layer 213. The plurality of electrodes 211i and 211o are electrically insulated from various interconnects in the memory chip 100 and various interconnects in the CMOS chip 200. On the upper surface located in the Z2 direction, of the conductor 210 in the discharge pad region DCR, the electrodes 211d_2 and 211d_3 are provided in the same layer as the insulating layer 213. The electrode 211d_2 has a rectangle-ring shape surrounding the active pad region AR and the inner dummy pad region IDR when viewed along the Z direction. The electrode 211d_3 has a rectangle-ring shape surrounding the electrode 211d_2 when viewed along the Z direction.

The gate electrode 203, the conductors 204, 206, 208, and 210, the interconnect layers 205, 207, and 209, and the electrodes 211a, 211i, 211d, and 211o are made of a conductive material, and may contain a metal material, a p-type semiconductor, an n-type semiconductor, or the like. The electrodes 211a, 211i, 211d, and 211o contain copper, for example. The gate insulating film 202, the insulating layer 212, and the insulating layer 213 contain silicon oxide as an insulating material, for example.

In the example of FIG. 7, the conductor 120_2 of the memory chip 100 is electrically coupled to the P-type impurity diffusion region PW of the semiconductor substrate 201 of the CMOS chip 200 via the electrodes 110d_2 and 211d_2. The conductor 120_3 of the memory chip 100 is electrically coupled to the N-type impurity diffusion region NW of the semiconductor substrate 201 of the CMOS chip 200 via the electrodes 110d_3 and 211d_3. Alternatively, the conductor 120_3 may be electrically coupled to the P-type impurity diffusion region PW, and the conductor 120_2 may be electrically coupled to the N-type impurity diffusion region NW.

1.1.6 Sectional Structure of Bonding Pad

Next, a sectional structure of the bonding pad BP will be described.

Figure 9:
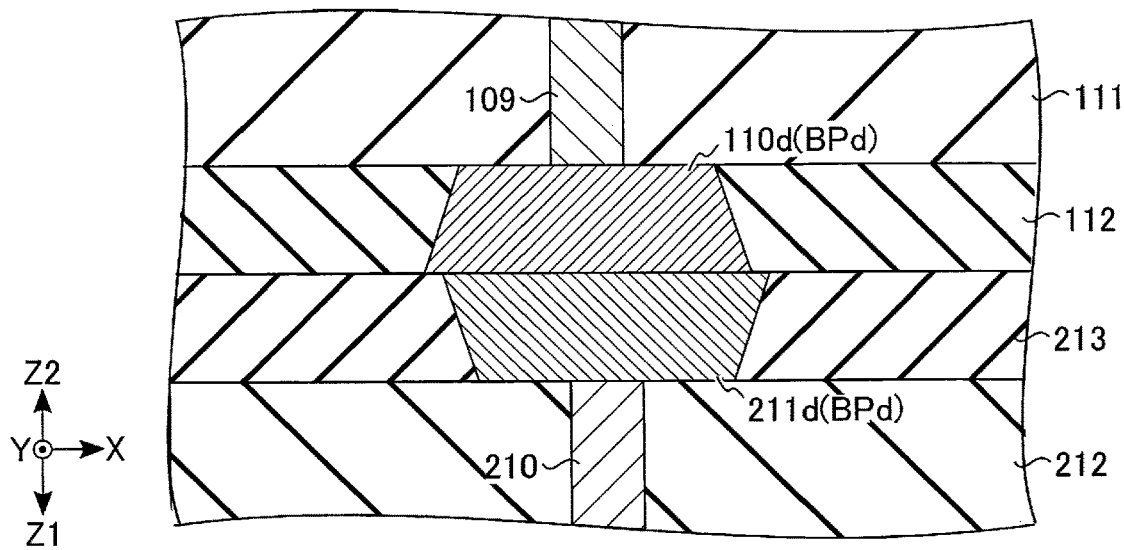
FIG. 9 is a sectional view illustrating an example of a sectional structure of the bonding pad of the memory device according to the first embodiment.

FIG. 9 is a sectional view illustrating an example of a sectional structure of a bonding pad of the memory device according to the first embodiment. The example of FIG. 9 shows the electrodes 110d and 211d (i.e., the electrodes 110d_2 and 211d_2, or the electrodes 110d_3 and 211d_3) included in the bonding pad BPd of the discharge pad region DCR. Note that the same description as the following description about the bonding pad BPd applies to the bonding pads BPa, BPi, and BPo.

As illustrated in FIG. 9, in the bonding process of the memory chip 100 and the CMOS chip 200, the electrode 110d is coupled to the electrode 211d. In the example of FIG. 9, the area of the electrode 110d and the area of the electrode 211d on the bonded surface are substantially equal to each other. In such a case, when copper is used for the electrode 110d and the electrode 211d, the copper of the electrode 110d and the copper of the electrode 211d are united together, which may make it difficult to recognize a boundary between the copper of the electrodes. However, bonding can be recognized by deformation of a bonded shape of the electrode 110d and the electrode 211d due to misalignment in bonding and by misalignment of copper barrier metals (occurrence of discontinuous portions in the side surfaces).

Further, in a case where the electrodes 110d and 211d are formed by a damascene method, each of the side surfaces has a tapered shape. For this reason, a section along the Z direction, of a portion where the electrode 110d and the electrode 211d are bonded, has a non-rectangular shape with non-linear side walls.

In addition, when the electrode 110d and the electrode 211d are bonded to each other, a bottom surface, side surfaces, and an upper surface of copper forming the electrodes are covered with a barrier metal. In contrast thereto, in a typical interconnect layer using copper, an insulating layer (silicon nitride, silicon carbonitride, or the like) having a function as an antioxidant against copper is provided on the upper surface of the copper, and no barrier metal is provided. Therefore, distinction from a typical interconnect layer is possible even if no misalignment in bonding occurs.

1.1.7 Sectional Structure of Memory Cell Array

Figure 10:
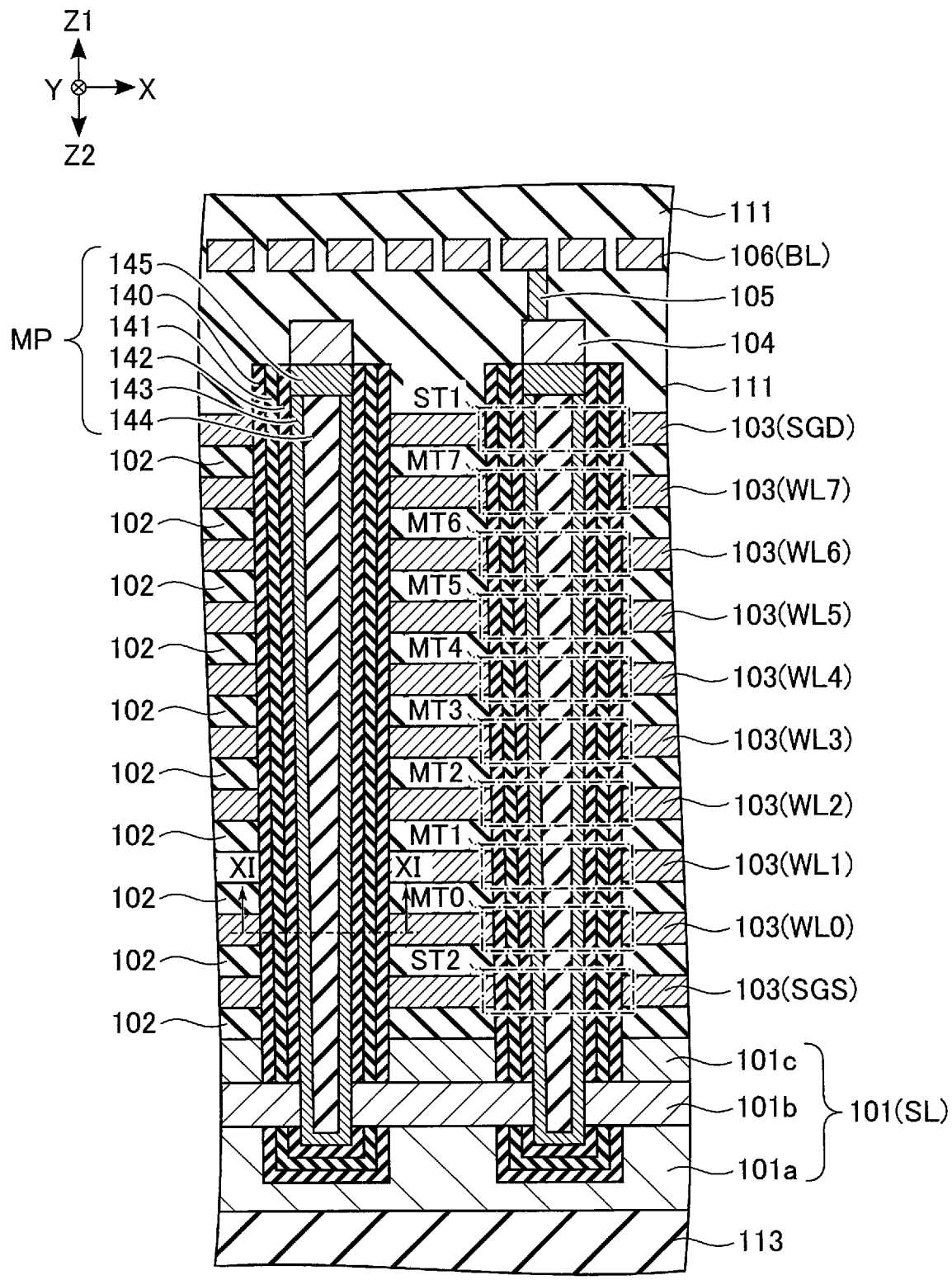
FIG. 10 is a sectional view illustrating an example of a sectional structure of the memory cell array of the memory device according to the first embodiment.

FIG. 10 is a sectional view illustrating an example of a sectional structure of the memory cell array of the memory device according to the first embodiment. FIG. 10 illustrates two memory pillars MP included in the memory cell array 10.

As illustrated in FIG. 10, the semiconductor layer 101 includes, for example, three semiconductor layers 101a, 101b, and 101c. The semiconductor layer 101b is provided on the upper surface of the semiconductor layer 101a located in the Z1 direction. The semiconductor layer 101c is provided on the upper surface of the semiconductor layer 101b located in the Z1 direction. The semiconductor layer 101b is formed by replacement of the insulating layer 121 provided between semiconductor layer 101a and semiconductor layer 101c, for example. The semiconductor layers 101a to 101c contain silicon, for example. Further, the semiconductor layers 101a to 101c contain phosphorus (P) as an impurity of a semiconductor, for example.

On the upper surface of the semiconductor layer 101 located in the Z1 direction, 10 insulating layers 102 and 10 interconnect layers 103 are stacked so as to alternate one by one. In the example of FIG. 10, the 10 interconnect layers 103 respectively function as the select gate line SGS, the word lines WL0 to WL7, and the select gate line SGD in order from the side closer to the semiconductor layer 101. Note that a plurality of interconnect layers 103 functioning as the select gate lines SGS and SGD may be provided. For example, a layered structure of titanium nitride (TiN)/ tungsten (W) may be used as a conductive material of the interconnect layer 103. In this case, Titanium nitride is formed so as to cover tungsten. Titanium nitride has a function as a barrier layer for suppressing oxidation of tungsten or as an adhesion layer for improving adhesion of tungsten in depositing tungsten by chemical vapor deposition (CVD), for example. Further, the interconnect layer 103 may contain a high dielectric-constant material such as aluminum oxide (AlO). In this case, the high dielectric-constant material is formed so as to cover the conductive material. For example, in each of the interconnect layers 103, a high dielectric-constant material is provided so as to be in contact with the insulating layer 102 provided above and below the interconnect layer 103 and the side surfaces of the memory pillars MP. Then, titanium nitride is provided so as to be in contact with the high dielectric-constant material. Then, tungsten is provided so as to be in contact with titanium nitride and be buried in the interconnect layer 103.

The insulating layer 111 is provided on the upper surface located in the Z1 direction, of the interconnect layer 103 functioning as the select gate line SGD.

The plurality of memory pillars MP are provided in the memory cell array 10. The memory pillars MP each have a substantially cylindrical shape extending along the Z direction. The memory pillars MP penetrate the 10 interconnect layers 103. The bottom surfaces of the memory pillars MP reach the semiconductor layer 101. Note that the memory pillars MP may have a structure in which a plurality of pillars are connected along the Z direction.

Next, an internal configuration of the memory pillar MP will be described. The memory pillar MP includes a block insulating film 140, a charge storage film 141, a tunnel insulating film 142, a semiconductor film 143, a core film 144, and a cap film 145.

On a part of the side surface and the bottom surface located in the Z2 direction in the memory pillar MP, the block insulating film 140, the charge storage film 141, and the tunnel insulating film 142 are stacked in this order from the outside. More specifically, in the same layer as the semiconductor layer 101b and the vicinity thereof, the block insulating film 140, the charge storage film 141, and the tunnel insulating film 142 on the side surface of the memory pillar MP are removed. The semiconductor film 143 is provided so as to be in contact with the side surface and the bottom surface of the tunnel insulating film 142 and the semiconductor layer 101b. The semiconductor film 143 is a region in which channels of the memory cell transistor MT and the select transistors ST1 and ST2 are formed. The core film 144 is buried in the semiconductor film 143. In the upper portion of the memory pillar MP located in the Z1 direction, the cap film 145 is provided at the upper ends of the semiconductor film 143 and the core film 144. The side surface of the cap film 145 is in contact with the tunnel insulating film 142. The cap film 145 contains silicon, for example. The conductor 104 is provided on the upper surface of the cap film 145 located in the Z1 direction. The conductor 105 is provided on the upper surface of the conductor 104 located in the Z1 direction. The conductor 105 is coupled to the interconnect layer 106.

Figure 11:
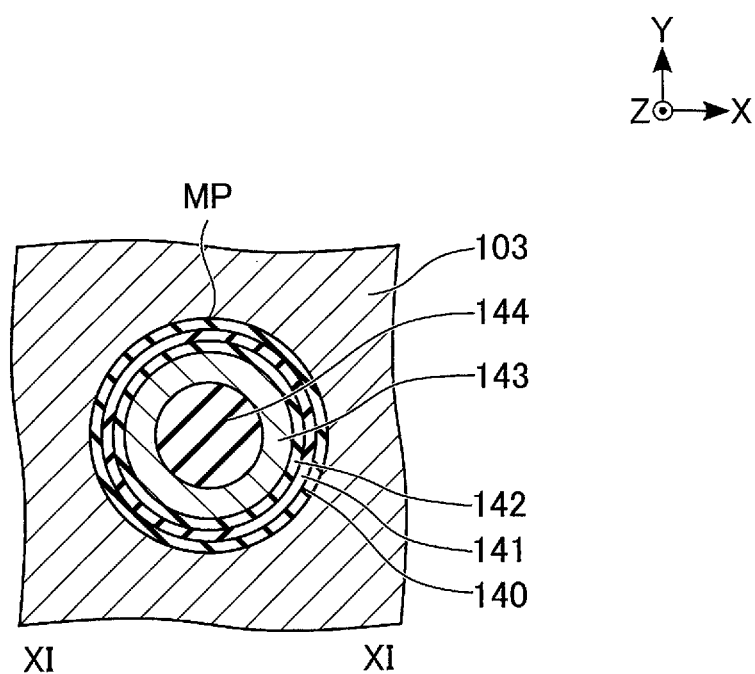
FIG. 11 is a sectional view taken along a line XI-XI in FIG. 10, illustrating an example of a sectional structure of a memory pillar of the memory device according to the first embodiment.

FIG. 11 is a sectional view taken along a line XI-XI in FIG. 10, illustrating an example of a sectional structure of the memory pillar of the memory device according to the first embodiment. More specifically, FIG. 11 illustrates a sectional structure of the memory pillar MP in a layer including the interconnect layer 103.

In the section including the interconnect layer 103, the core film 144 is provided, for example, in the center of the memory pillar MP. The semiconductor film 143 surrounds the side surface of the core film 144. The tunnel insulating film 142 surrounds the side surface of the semiconductor film 143. The charge storage film 141 surrounds the side surface of the tunnel insulating film 142. The block insulating film 140 surrounds the side surface of the charge storage film 141. The interconnect layer 103 surrounds the side surface of the block insulating film 140.

The semiconductor film 143 is used as channels (current paths) of the memory cell transistors MT0 to MT7 and the select transistors ST1 and ST2. Each of the tunnel insulating film 142 and the block insulating film 140 contains, for example, silicon oxide. The charge storage film 141 has a function of storing charge therein. The charge storage film 141 contains silicon nitride, for example.

The memory pillars MP and the interconnect layers 103 functioning as the word lines WL0 to WL7 are combined, thereby forming the memory cell transistors MT0 to MT7. Likewise, the memory pillars MP and the interconnect layer 103 functioning as the select gate line SGD are combined, thereby forming the select transistor ST1. The memory pillars MP and the interconnect layer 103 functioning as the select gate line SGS are combined, thereby forming the select transistor ST2. Thus, each of the memory pillars MP can function as the NAND string NS.

1.2 Effects of First Embodiment

According to the first embodiment, the yield of the memory device 3 can be improved. This effect will be described below.

The bonded surface between the memory chip 100 and the CMOS chip 200 is divided into the active pad region AR, the inner dummy pad region IDR, the discharge pad region DCR, the outer dummy pad region ODR, and the kerf region KR. In the discharge pad region DCR, the bonding pad BPd_2 electrically coupling the wall structure W_2 and the P-type impurity diffusion region PW and the bonding pad BPd_3 electrically coupling the wall structure W_3 and the N-type impurity diffusion region NW are provided. Each of the bonding pad BPd_2 and the wall structure W_2 includes a continuous conductor surrounding the inner dummy pad region IDR and the active pad region AR. Each of the bonding pad BPd_3 and the wall structure W_3 includes a continuous conductor surrounding the bonding pad BPd_2 and the wall structure W_2. It is designed such that the coverage of the bonding pads BPd_2 and BPd_3 in the discharge pad region DCR is equal to or more than 3% and equal to or less than 40%. This can prevent a difference between the coverage in the discharge pad region DCR and the coverage in its neighboring region from being excessively large. Thus, during a process such as chemical mechanical polishing (CMP) in a process of forming the bonded surface in each of the memory chip 100 and the CMOS chip 200, a level difference can be prevented from occurring due to erosion in the discharge pad region DCR.

Therefore, occurrence of a bonding failure in the bonding process of the memory chip 100 and the CMOS chip 200 can be reduced.

More specifically, the distance P between the bonding pad BPd_2 and the bonding pad BPd_3 is longer than the distance P0 between the conductor 120_2 and the conductor 120_3. This can reduce the coverage of the bonding pads BPd_2 and BPd_3 in the discharge pad region DCR as compared to a case where the distance P and the distance P0 are equal, while satisfying the provision regarding the wall structures W_1 to W_4.

It is additionally noted that the wall structure W_2 includes the conductor 120_2 that electrically couples the interconnect layer 116 and the P-type impurity diffusion region PW. The wall structure W_3 includes the conductor 120_3 that electrically couples the interconnect layer 116 and the N-type impurity diffusion region NW. The conductors 120_2 and 120_3 have a structure that is long (deep) along the Z direction. In order to form the conductors 120_2 and 120_3 with a sufficiently accurate length, it is desirable to simultaneously form the wall structure W_1 including the conductor 120_1 and the wall structure W_4 including the conductor 120_4 that are arranged such that the conductors 120_2 and 120_3 are interposed therebetween.

However, there is a limit to regions allocated to formation of the wall structures W_1 to W_4. For this reason, in a case where the distance P and the distance P0 are equal, there is a possibility that the coverage of the bonding pads BPd_2 and BPd_3 in the discharge pad region DCR cannot satisfactorily suppress occurrence of a bonding failure. Meanwhile, a relatively large margin is left in a region allocated to formation of the P-type impurity diffusion region PW and the N-type impurity diffusion region NW on the side closer to the CMOS chip 200.

According to the first embodiment, when viewed along the Z direction, a portion of the interconnect layer 108_2 that overlaps the bonding pad BPd_2 is positioned closer to the inner dummy pad region IDR than a portion that overlaps the conductor 120_2. When viewed along the Z direction, a portion of the interconnect layer 108_3 that overlaps the bonding pad BPd_3 is positioned closer to the outer dummy pad region ODR than a portion that overlaps the conductor 120_3. This can make the distance P longer than the distance P0 while satisfying the provision regarding the wall structures W_1 to W_4.

Further, in the outer dummy pad region ODR, the bonding pad BPo electrically insulated from the semiconductor substrate 201 is formed. It is designed such that the coverage of the bonding pad BPo in the outer dummy pad region ODR is equal to or more than 3% or and equal to or less than 20%. Alternatively, in each of the memory chip 100 and the CMOS chip 200, it is designed such that the coverage of the bonding pad BPo in the outer dummy pad region ODR is equal to or more than 1/3 and equal to or less than 2/3 of the coverage of the bonding pads BPd_2 and BPd_3 in the discharge pad region DCR. This can make a coverage gradient between the kerf region KR with a 0% coverage and the discharge pad region DCR with a relatively large coverage, gentle. Thus, a level difference can be prevented from occurring due to erosion in the discharge pad region DCR, the outer dummy pad region ODR, and the kerf region KR. Therefore, occurrence of a bonding failure in the bonding process of the memory chip 100 and the CMOS chip 200 can be reduced.

2. Second Embodiment

Next, the memory device 3 according to a second embodiment will be described. The memory device 3 according to the second embodiment is different from the memory device 3 according to the first embodiment in that the area of the bonding pad BP on the side closer to the memory chip 100 and the area of the bonding pad BP on the side closer to the CMOS chip 200 are different from each other. In the following description, description of a configuration similar to that of the first embodiment will be omitted, and a configuration different from that of the first embodiment will be mainly described.

2.1 Sectional Structure of Bonding Pad

FIG. 12 is a sectional view illustrating a first example of a sectional structure of a bonding pad of the memory device according to the second embodiment. FIG. 13 is a sectional view illustrating a second example of a sectional structure of a bonding pad of the memory device according to the second embodiment. FIGS. 12 and 13 correspond to FIG. 9 in the first embodiment. The example of FIG. 12 shows electrodes $110d$ and $211d'$ (i.e., electrodes $110d\_2$ and $211d\_2'$, or electrodes $110d\_3$ and $211d\_3'$) included in a bonding pad BPd' in the discharge pad region DCR. The example of FIG. 13 shows electrodes $110d'$ and $211d$ (i.e., electrodes $110d\_2'$ and $211d\_2$, or electrodes $110d\_3'$ and $211d\_3$) included in the bonding pad BPd' in the discharge pad region DCR.

In the first example shown in FIG. 12, the electrode $211d$ is replaced with the electrode $211d'$. The area of the electrode $211d'$ in the bonded surface is smaller than the area of the electrode $110d$ in the bonded surface.

In the second example shown in FIG. 13, the electrode $110d$ is replaced with the electrode $110d'$. The area of the electrode $110d'$ in the bonded surface is smaller than the area of the electrode $211d$ in the bonded surface.

2.2 Effects of Second Embodiment

According to the second embodiment, in the discharge pad region DCR, the area of the bonding pad BPd' in the bonded surface on the side closer to the memory chip 100 is different from the area of the bonding pad BPd' in the bonded surface on the side closer to the CMOS chip 200. This prevents a small-area electrode from extending off a large-area electrode in the bonded surface in spite of possible misalignment between the memory chip 100 and the CMOS chip 200 during the bonding process.

Further, the coverage of the small-area electrode in the bonded surface in the discharge pad region DCR can be further reduced. This prevents a level difference from occurring due to erosion in the discharge pad region DCR. Therefore, occurrence of a bonding failure in the bonding process of the memory chip 100 and the CMOS chip 200 can be reduced.

3. Third Embodiment

Next, the memory device 3 according to a third embodiment will be described. The memory device 3 according to the third embodiment is different from the memory device 3 according to the first embodiment in that a bonding pad on at least one of sides in the discharge pad region DCR does not have a rectangle-ring shape. In the following description, description of a configuration similar to that of the first embodiment will be omitted, and a configuration different from that of the first embodiment will be mainly described.

3.1 Planar Layout of Bonding Pads

First, a first example will be described. The first example is directed to a case where a bonding pad on the inner side in the discharge pad region DCR does not have a rectangle-ring shape.

Figure 14:
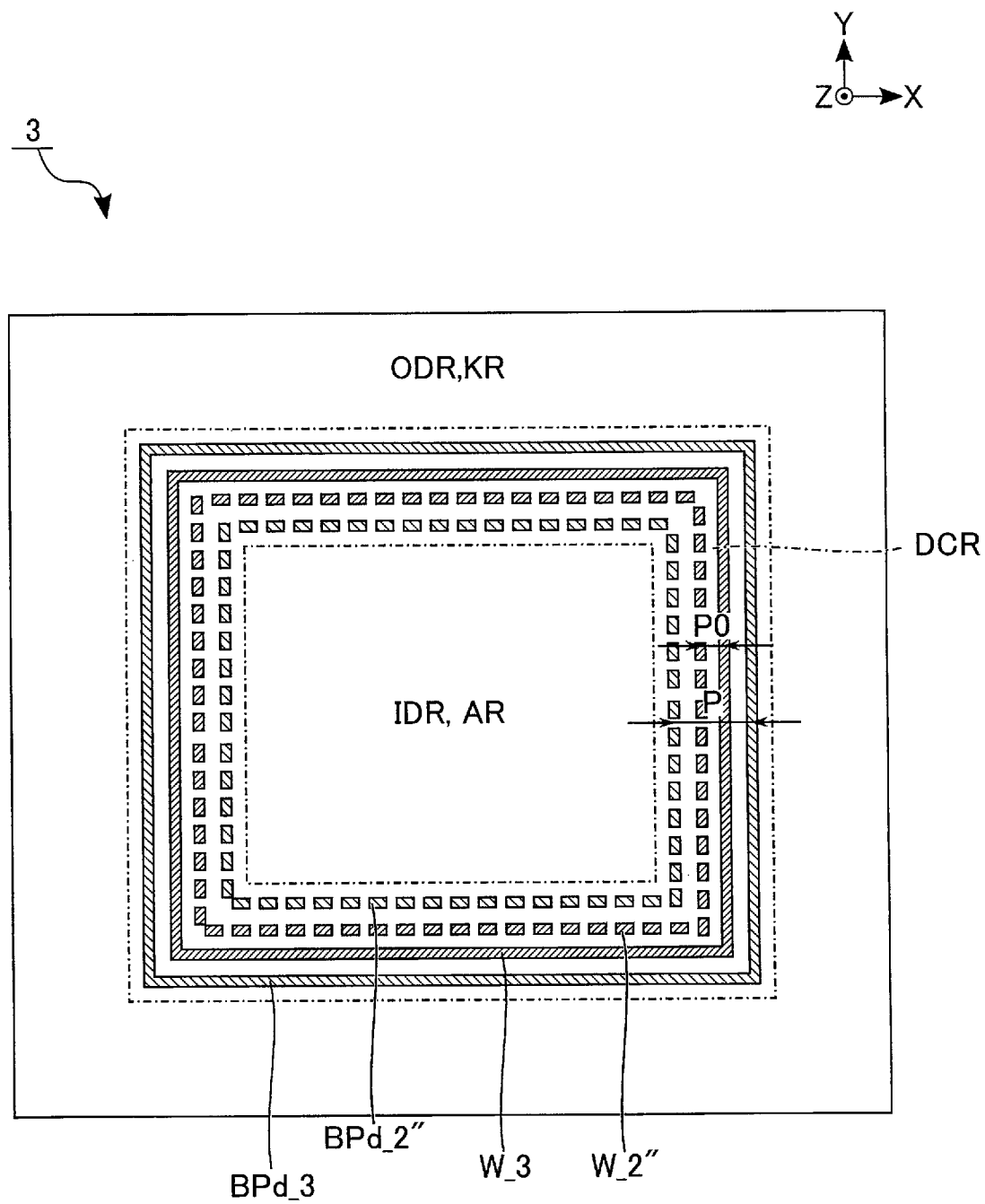
FIG. 14 is a plan view illustrating a first example of a planar layout of a part of wall structures and bonding pads in a discharge pad region of a memory device according to a third embodiment.

FIG. 14 is a plan view illustrating the first example of a planar layout of a part of wall structures and bonding pads in the discharge pad region of the memory device according to the third embodiment. FIG. 15 is a plan view illustrating the first example of a planar layout of bonding pads in the discharge pad region of the memory device according to the third embodiment. FIGS. 14 and 15 correspond to FIGS. 8 and 5 in the first embodiment, respectively.

As illustrated in FIG. 14, in the discharge pad region DCR, bonding pads BPd_2" and BPd_3 are arranged. Then, the memory chip 100 is further provided with a wall structure W_2" corresponding to the bonding pad BPd_2" and the wall structure W_3 corresponding to the bonding pad BPd_3.

The bonding pad BPd_2" includes a plurality of rectangular conductors that are arranged so as to surround the active pad region AR and the inner dummy pad region IDR while being spaced from each other. The wall structure W_2" includes a plurality of rectangular conductors that are arranged so as to surround the bonding pad BPd_2" when viewed along the Z direction, while being spaced from each other.

The wall structure W_3 has a rectangle-ring shape surrounding the wall structure W_2". The bonding pad BPd_3 has a rectangle-ring shape surrounding the wall structure W_3 when viewed along the Z direction.

A distance P between the bonding pad BPd_2" and the bonding pad BPd_3 is longer than a distance P0 between the wall structure W_2" and the wall structure W_3.

As illustrated in FIG. 15, the coverage of the bonding pads BPd_2" and BPd_3 in the discharge pad region DCR is calculated as a ratio of the area covered by the bonding pads BPd_2" and BPd_3 to the area of a unit region UDCR1, for example. The unit region UDCR1 is, for example, a rectangular region having a line passing through the centers of the width D2 of each position in the bonding pad BPd_2" and a line passing through the centers of the width D3 of each position in the bonding pad BPd_3 as two opposing sides. Both ends of the side along the line passing through the centers of the width D2 of each position in the bonding pad BPd_2" in the rectangular region forming the unit region UDCR1 are positioned, for example, in the centers of two adjacent electrodes, respectively, in the bonding pad BPd_2". It is designed such that the coverage of the bonding pads BPd_2" and BPd_3 in the discharge pad region DCR is equal to or more than 3% and equal to or less than 40%, for example.

Next, a second example will be described. The second example is directed to a case where a bonding pad on the outer side in the discharge pad region DCR does not have a rectangle-ring shape.

FIG. 16 is a plan view illustrating the second example of a planar layout of a part of wall structures and bonding pads in the discharge pad region of the memory device according to the third embodiment. FIG. 17 is a plan view illustrating the second example of a planar layout of bonding pads in the discharge pad region of the memory device according to the third embodiment. FIGS. 16 and 17 correspond to FIGS. 8 and 5 in the first embodiment, respectively.

As illustrated in FIG. 16, bonding pads BPd_2 and BPd_3" are arranged in the discharge pad region DCR. Then, the wall structure W_2 corresponding to the bonding pad BPd_2 and a wall structure W_3" corresponding to the bonding pad BPd_3" are further provided.

The bonding pad BPd_2 has a rectangle-ring shape surrounding the active pad region AR and the inner dummy pad region TDR. The wall structure W_2 has a rectangle-ring shape surrounding the bonding pad BPd_2 when viewed along the Z direction.

The wall structure W_3" includes a plurality of rectangular conductors that are arranged so as to surround the wall structure W_2 while being spaced from each other. The bonding pad BPd_3" includes a plurality of rectangular conductors that are arranged so as to surround the wall structure W_3" when viewed along the Z direction, while being spaced from each other.

A distance P between the bonding pad BPd_2 and the bonding pad BPd_3" is longer than a distance P0 between the wall structure W_2 and the wall structure W_3".

As illustrated in FIG. 17, the coverage of the bonding pads BPd_2 and BPd_3" in the discharge pad region DCR is calculated as a ratio of the area covered by the bonding pads BPd_2 and BPd_3" to the area of a unit region UDCR2, for example. The unit region UDCR2 is, for example, a rectangular region having a line passing through the centers of the width D2 of each position in the bonding pad BPd_2 and a line passing through the centers of the width D3 of each position in the bonding pad BPd_3" as two opposing sides. Both ends of the side along the line passing through the centers of the width D3 of each position in the bonding pad BPd_3" in the rectangular region forming the unit region UDCR2 are positioned, for example, in the centers of two adjacent electrodes, respectively, in the bonding pad BPd_3". It is designed such that the coverage of the bonding pads BPd_2 and BPd_3" in the discharge pad region DCR is equal to or more than 3% and equal to or less than 40%, for example.

3.2 Effects of Third Embodiment

According to the first example of the third embodiment, the bonding pad BPd_2" includes a plurality of rectangular conductors that are arranged so as to surround the active pad region AR and the inner dummy pad region IDR when viewed along the Z direction, while being spaced from each other. According to the second example of the third embodiment, the bonding pad BPd_3" includes a plurality of rectangular conductors that are arranged so as to surround the wall structure W_3" when viewed along the Z direction, while being spaced from each other. This can further reduce the coverage of the bonding pads BPd in the discharge pad region DCR as compared to a case where each of the bonding pads BPd_2 and BPd_3 is formed as a continuous conductor. This prevents a level difference from occurring due to erosion in the discharge pad region DCR. Therefore, occurrence of a bonding failure in the bonding process of the memory chip 100 and the CMOS chip 200 can be reduced.

4. Modifications

4.1 First Modification

In the first embodiment, the second embodiment, and the third embodiment that have been described above, the case where no further wall structure is formed on the side closer to the kerf region KR than the wall structures W_1 to W_4 has been described. However, the present invention is not limited thereto. For example, an additional wall structure may be formed on the side closer to the kerf region KR than the wall structures W_1 to W_4.

FIG. 18 is a plan view illustrating an example of a planar layout of bonding pads of a memory device according to a first modification. FIG. 18 corresponds to FIG. 4 in the first embodiment.

As illustrated in FIG. 18, in the outer dummy pad region ODR, a bonding pad BPc may be arranged in addition to the bonding pads BPo. The bonding pad BPc includes, for example, a continuous electrode. The electrode included in the bonding pad BPc has a rectangle-ring shape surrounding the bonding pad BPd_3. Note that at least a part of the bonding pads BPo may be arranged between the bonding pad BPd_3 and the bonding pad BPc. At least a part of the bonding pads BPo may be arranged between the bonding pad BPc and the kerf region KR.

Figure 19:
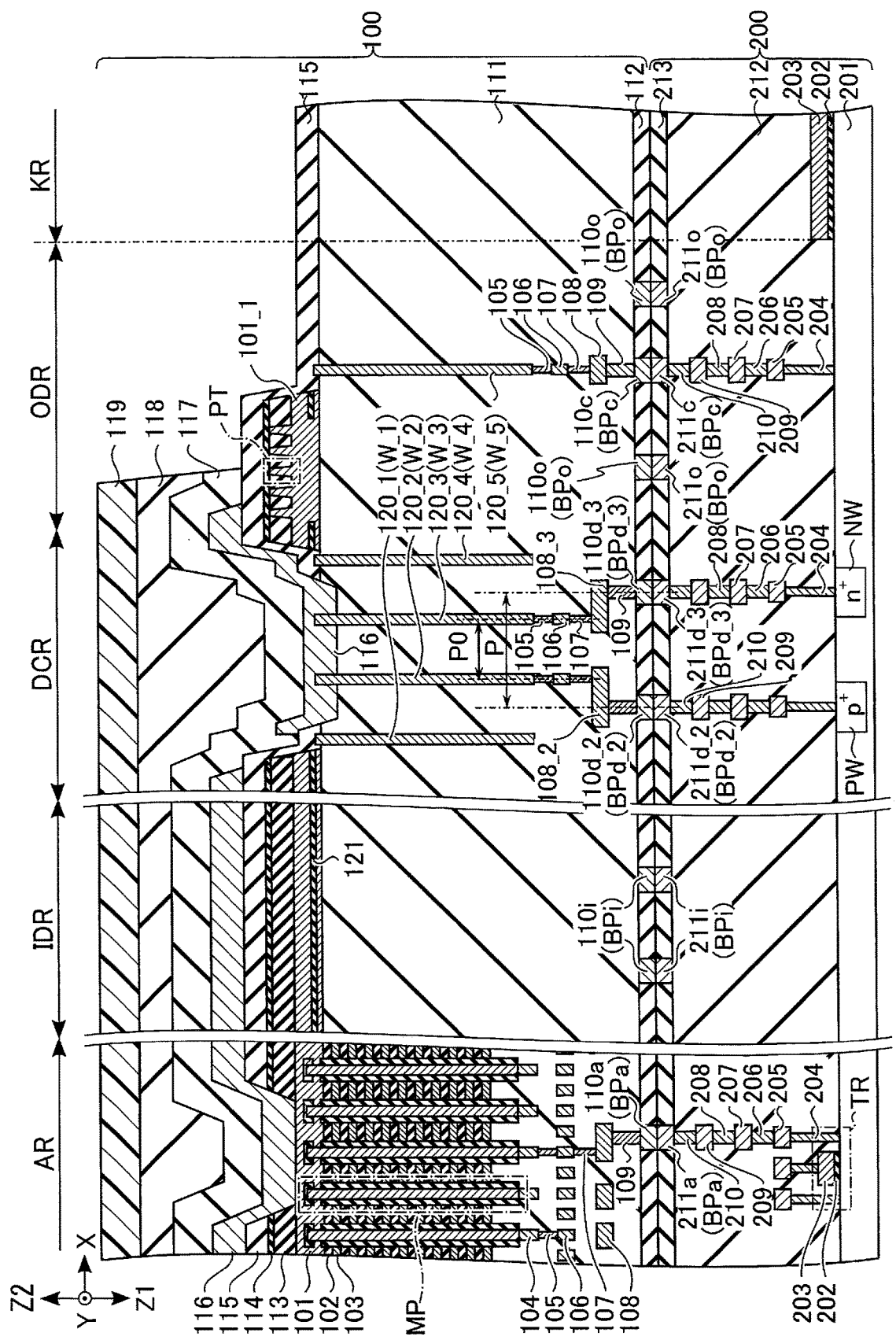
FIG. 19 is a sectional view illustrating an example of a sectional structure of the memory device according to the first modification.

FIG. 19 is a sectional view illustrating an example of a sectional structure of the memory device according to the first modification. FIG. 19 corresponds to FIG. 7 in the first embodiment.

As illustrated in FIG. 19, the outer dummy pad region ODR is provided with a wall structure W_5 provided in the memory chip 100 and various interconnects coupling the wall structure W_5 and the semiconductor substrate 201. The wall structure W_5 includes a conductor 120_5.

The conductor 120_5 has a rectangle-ring shape surrounding the conductor 120_4 when viewed along the Z direction. The conductor 120_5 extends along the Z direction. An end of the conductor 120_5 located in the Z2 direction is in contact with the insulating layer 115 on the side closer to the kerf region KR than a semiconductor layer 101_1, for example. That is, the conductor 120_5 is positioned in a region not covered with the surface protection layer 119 when viewed along the Z direction. The conductor 120_5 is electrically coupled to an electrode 211c of the CMOS chip 200 via its corresponding conductor 105, its corresponding interconnect layer 106, its corresponding conductor 107, its corresponding interconnect layer 108, its corresponding conductor 109, and its corresponding electrode 110c. The electrodes 110c and 211c correspond to the bonding pad BPc. That is, the electrodes 110c and 211c have rectangle-ring shapes surrounding the electrodes 110d_3 and 211d_3, respectively, when viewed along the Z direction. The electrode 211c is electrically coupled to the semiconductor substrate 201 via its corresponding conductor 210, its corresponding interconnect layer 209, its corresponding conductor 208, its corresponding interconnect layer 207, its corresponding conductor 206, its corresponding interconnect layer 205, and its corresponding conductor 204.

Each of the conductor 105, the interconnect layer 106, the conductor 107, the interconnect layer 108, and the conductor 109 that electrically couple the conductor 120_5 and the electrode 110c has, for example, a rectangle-ring shape when viewed along the Z direction. Each of the conductor 210, the interconnect layer 209, the conductor 208, the interconnect layer 207, the conductor 206, the interconnect layer 205, and the conductor 204 that electrically couple the semiconductor substrate 201 and the electrode 211c has, for example, a rectangle-ring shape when viewed along the Z direction.

With the above-described configuration, the wall structure W_5 and the various interconnects coupling the wall structure W_5 and the semiconductor substrate 201 can function as a part of an additional wall structure (crack stopper) that prevents a possible crack, separation, or the like occurring in an end of the memory device 3 from propagating to the active pad region AR in the dicing process. Therefore, the yield of the memory device 3 can be improved.

4.2 Second Modification

Further, in the first embodiment, the second embodiment, the third embodiment, and the first modification that have been described above, the case where the wall structures W_2 and W_3 do not overlap the bonding pads BPd_2 and BPd_3, respectively, when viewed along the Z direction has been described. However, the present invention is not limited thereto. For example, the wall structures W_2 and W_3 may be configured so as to overlap the bonding pads BPd_2 and BPd_3, respectively. Further, at least one of the wall structures W_1 and W_4 may be omitted. Below, a configuration different from that of the first modification will be mainly described. Description of a configuration similar to that of the first modification will be omitted.

Figure 20:
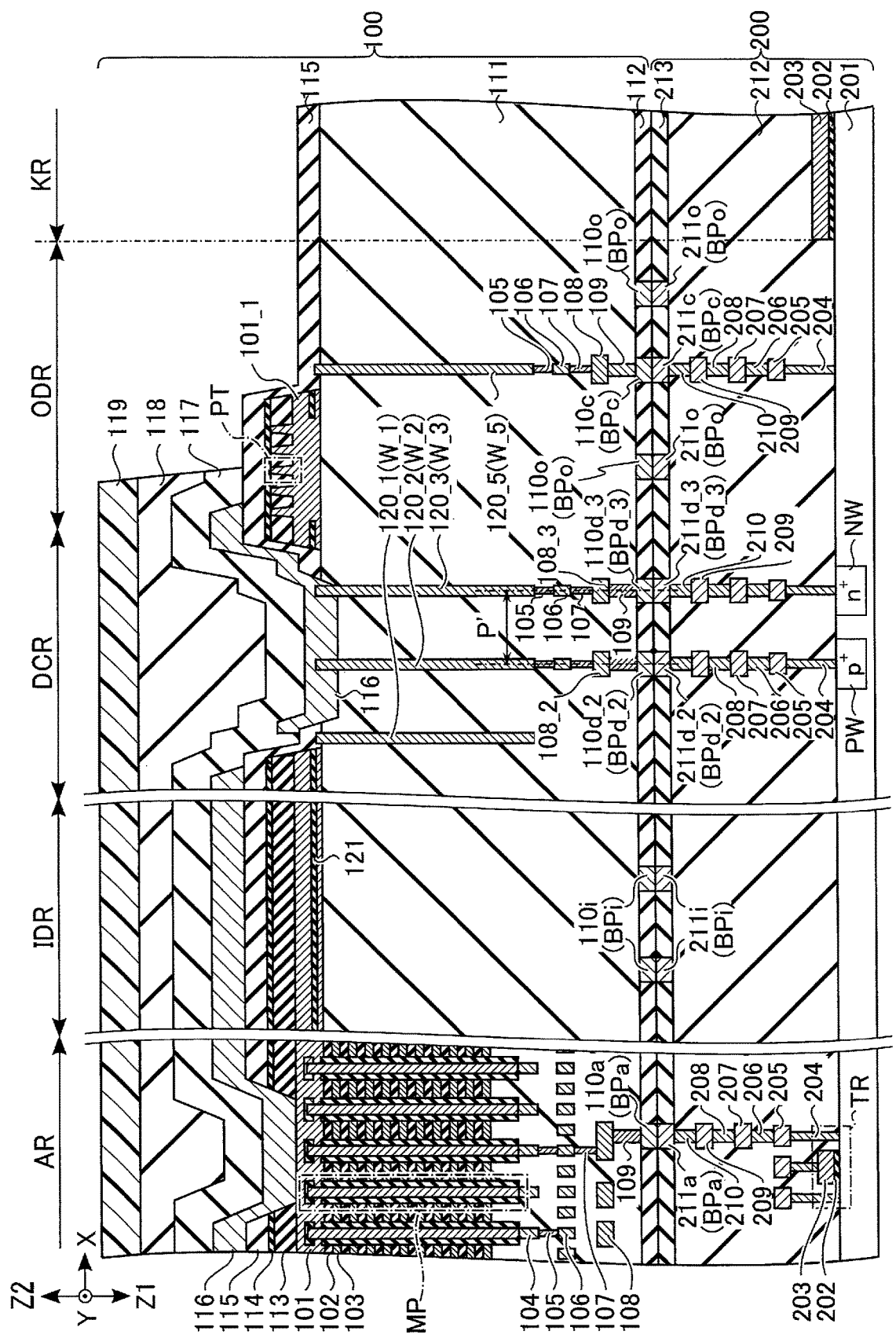
FIG. 20 is a sectional view illustrating an example of a sectional structure of a memory device according to a second modification.

FIG. 20 is a sectional view illustrating an example of a sectional structure of a memory device according to a second modification. FIG. 20 corresponds to FIG. 19 in the first modification.

As illustrated in FIG. 20, the discharge pad region DCR is provided with the wall structures W_1 to W_3 provided in the memory chip 100 and various interconnects coupling the wall structures W_1 to W_3 and the semiconductor substrate 201. The wall structure W_4 illustrated in FIG. 19 is not provided.

The wall structure W_2, the bonding pad BPd_2, and the conductor 105, the interconnect layer 106, the conductor 107, the interconnect layer 108_2, and the conductor 109 that connect the wall structure W_2 and the bonding pad BPd_2 overlap each other when viewed along the Z direction. In other words, the wall structure W_2, the bonding pad BPd_2, and the conductor 105, the interconnect layer 106, the conductor 107, the interconnect layer 108_2, and the conductor 109 that couple the wall structure W_2 and the bonding pad BPd_2 are arranged along the Z direction without being bent along the XY plane, as a whole.

Likewise, the wall structure W_3, the bonding pad BPd_3, and the conductor 105, the interconnect layer 106, the conductor 107, the interconnect layer 108_3, and the conductor 109 that couple the wall structure W_3 and the bonding pad BPd_3 overlap each other when viewed along the Z direction. In other words, the wall structure W_3, the bonding pad BPd_3, and the conductor 105, the interconnect layer 106, the conductor 107, the interconnect layer 108_3, and the conductor 109 that couple the wall structure W_3 and the bonding pad BPd_3 are arranged along the Z direction without being bent with respect to the XY plane, as a whole.

This makes the distance between the wall structure W_2 and the wall structure W_3 and the distance between the bonding pad BPd_2 and the bonding pad BPd_3 substantially equal to each other, i.e., equal to a distance P'.

According to the second modification, because of omission of the wall structure W_4, the provision regarding a region allocated to formation of the wall structures W_1 to W_3 is relaxed. This can ensure the distance P' between the bonding pad BPd_2 and the bonding pad BPd_3 while satisfying the provision regarding the coverage without bending each of the structure between the wall structure W_2 and the bonding pad BPd_2 and the structure between the wall structure W_3 and the bonding pad BPd_3.

Further, in the second modification, the wall structure W_5 is provided. Thus, the wall structure W_5 can function also as a substitute for the omitted wall structure W_4.

Therefore, the influence of omission of the wall structure W_4 on formation of the wall structures W_2 and W_3 can be reduced.

Although some embodiments of the present invention have been described, these embodiments have been presented as examples, and are not intended to limit the scope of the invention. These novel embodiments can be implemented in various other forms, and various omissions, replacements, and alterations can be made without departing from the gist of the invention. These embodiments and modifications thereof are included in the scope and gist of the invention, and are included in the invention described in the claims and the equivalent scope thereof.

What is claimed is:

1. A memory device comprising
a first chip and a second chip that are in contact with each other on a first surface divided into a first region, a second region surrounding the first region, and a third region surrounding the second region, wherein
the first chip includes:
  a substrate including a first diffusion region of a first conductivity type and a second diffusion region of a second conductivity type different from the first conductivity type;
  a first electrode unit including a continuous conductor surrounding the first region in the second region; and
  a second electrode unit surrounding the first region while being spaced from the first electrode unit in the second region,
the second chip includes:
  a first interconnect layer;
  a third electrode unit including a continuous conductor surrounding the first region in the second region and being in contact with the first electrode unit;
  a fourth electrode unit surrounding the first region while being spaced from the third electrode unit in the second region and being in contact with the second electrode unit;
  a first wall unit being in contact with the first interconnect layer, including a continuous conductor surrounding the first region, and being electrically coupled to the first diffusion region via the third electrode unit and the first electrode unit; and
  a second wall unit being in contact with the first interconnect layer, surrounding the first region while being spaced from the first wall unit, and being electrically coupled to the second diffusion region via the fourth electrode unit and the second electrode unit, and
each of a first ratio of an area covered by the first electrode unit and the second electrode unit to the second region, and a second ratio of an area covered by the third electrode unit and the fourth electrode unit to the second region is equal to or more than 3% and is equal to or less than 40%.

2. The memory device according to claim 1, wherein
a distance between the third electrode unit and the fourth electrode unit is longer than a distance between the first wall unit and the second wall unit.

3. The memory device according to claim 1, wherein
each of the second electrode unit, the fourth electrode unit, and the second wall unit includes a continuous conductor surrounding the first region.

4. The memory device according to claim 1, wherein
each of the second electrode unit, the fourth electrode unit, and the second wall unit includes a plurality of conductors being arranged so as to surround the first region while being spaced from each other.

5. The memory device according to claim 1, wherein
an area of the first electrode unit in the first surface is substantially same as an area of the third electrode unit in the first surface.

6. The memory device according to claim 1, wherein
an area of the first electrode unit in the first surface is different from an area of the third electrode unit in the first surface.

7. The memory device according to claim 1, wherein
the first chip further includes a fifth electrode unit provided in the third region,
the second chip further includes a sixth electrode unit that is provided in the third region and is in contact with the fifth electrode unit, and
the fifth electrode unit and the sixth electrode unit are electrically insulated from the substrate.

8. The memory device according to claim 7, wherein
each of a third ratio of an area covered by the fifth electrode unit to the third region and a fourth ratio of an area covered by the sixth electrode unit to the third region is equal to or more than 3% and is equal to or less than 20%.

9. The memory device according to claim 7, wherein
a third ratio of an area covered by the fifth electrode unit to the third region is equal to or more than one-third of the first ratio and is equal to or less than two-thirds of the first ratio, and
a fourth ratio of an area covered by the sixth electrode unit to the third region is equal to or more than one-third of the second ratio and is equal to or less than two-thirds of the second ratio.

10. The memory device according to claim 1, wherein
the first chip further includes a seventh electrode unit provided in the third region, and
the second chip further includes:
  an eighth electrode unit that is provided in the third region and is in contact with the seventh electrode unit; and
  a third wall unit surrounding the second region and being electrically coupled to the substrate via the eighth electrode unit and the seventh electrode unit.

11. The memory device according to claim 1, wherein
the first region is divided into a fourth region and a fifth region surrounding the fourth region,
the first chip further includes:
  a ninth electrode unit provided in the fourth region; and
  a tenth electrode unit provided in the fifth region,
the second chip further includes:
  an eleventh electrode unit that is provided in the fourth region and is in contact with the ninth electrode unit; and
  a twelfth electrode unit that is provided in the fifth region and is in contact with the tenth electrode unit,
the ninth electrode unit and the eleventh electrode unit are electrically coupled to the substrate, and
the tenth electrode unit and the twelfth electrode unit are electrically insulated from the substrate.

12. The memory device according to claim 11, wherein
the second chip further includes a memory cell array electrically coupled to the substrate via the eleventh electrode unit and the ninth electrode unit.

13. The memory device according to claim 1, wherein
each of the first electrode unit and the second electrode unit has a width of 0.1 micrometer or more and 1.0 micrometer or less along a direction in which the first electrode unit and the second electrode unit are arranged.

14. A memory device comprising
a first chip and a second chip that are in contact with each other on a first surface divided into a first region, a second region surrounding the first region, and a third region surrounding the second region, wherein
the first chip includes:
   a substrate including a first diffusion region of a first conductivity type and a second diffusion region of a second conductivity type different from the first conductivity type;
   a first electrode unit surrounding the first region in the second region; and
   a second electrode unit surrounding the first region while being spaced from the first electrode unit in the second region,
the second chip includes:
   a first interconnect layer;
   a third electrode unit surrounding the first region in the second region and being in contact with the first electrode unit;
a fourth electrode unit surrounding the first region while being spaced from the third electrode unit in the second region and being in contact with the second electrode unit;
   a first wall unit being in contact with the first interconnect layer, surrounding the first region, and being electrically coupled to the first diffusion region via the third electrode unit and the first electrode unit; and
   a second wall unit being in contact with the first interconnect layer, surrounding the first region while being spaced from the first wall unit, and being electrically coupled to the second diffusion region via the fourth electrode unit and the second electrode unit, and
a distance between the third electrode unit and the fourth electrode unit is longer than a distance between the first wall unit and the second wall unit.

15. The memory device according to claim 14, wherein
the first chip further includes a fifth electrode unit provided in the third region,
the second chip further includes a sixth electrode unit that is provided in the third region and is in contact with the fifth electrode unit, and
the fifth electrode unit and the sixth electrode unit are electrically insulated from the substrate.

16. The memory device according to claim 15, wherein
each of a first ratio of an area covered by the first electrode unit and the second electrode unit to the second region and a second ratio of an area covered by the third electrode unit and the fourth electrode unit to the second region is equal to or more than 3% and is equal to or less than 40%.

17. The memory device according to claim 16, wherein
each of a third ratio of an area covered by the fifth electrode unit to the third region and a fourth ratio of an area covered by the sixth electrode unit to the third region is equal to or more than 3% and is equal to or less than 20%.

18. The memory device according to claim 16, wherein
a third ratio of an area covered by the fifth electrode unit to the third region is equal to or more than one-third of the first ratio and is equal to or less than two-thirds of the first ratio, and
a fourth ratio of an area covered by the sixth electrode unit to the third region is equal to or more than one-third of the second ratio and is equal to or less than two-thirds of the second ratio.

19. The memory device according to claim 14, wherein
the first chip further includes a seventh electrode unit provided in the third region, and
the second chip further includes:
   an eighth electrode unit that is provided in the third region and is in contact with the seventh electrode unit; and
   a third wall unit surrounding the second region and being electrically coupled to the substrate via the eighth electrode unit and the seventh electrode unit.

20. The memory device according to claim 14, wherein
the second chip further includes:
   a first conductor including a first portion overlapping the first wall unit and a second portion overlapping the third electrode unit when viewed along a first direction intersecting the first surface;
   a second conductor extending in the first direction and coupling between the first wall unit and the first portion;
   a third conductor extending in the first direction and coupling between the third electrode unit and the second portion;
   a fourth conductor including a third portion overlapping the second wall unit and a fourth portion overlapping the fourth electrode unit when viewed along the first direction;
   a fifth conductor extending in the first direction and coupling between the second wall unit and the third portion; and
   a sixth conductor extending in the first direction and coupling between the fourth electrode unit and the fourth portion,
the second portion is positioned closer to the first region than the first portion, and
the fourth portion is positioned closer to the third region than the third portion.

* * * * *